(12) United States Patent
Chopra et al.

(10) Patent No.: US 10,781,509 B2
(45) Date of Patent: Sep. 22, 2020

(54) NON-JOULIAN MAGNETOSTRICTIVE MATERIALS AND METHOD OF MAKING THE SAME

(71) Applicants: Temple University-of the Commonwealth System of Higher Education, Philadelphia, PA (US); UNIVERSITY OF MARYLAND, College Park, MD (US)

(72) Inventors: Harsh Deep Chopra, Philadelphia, PA (US); Manfred Wuttig, Silver Spring, MD (US)

(73) Assignee: Temple University—Of The Commonwealth System of Higher Education, Philadelphia, PA (US)

( * ) Notice: Subject to any disclaimer, the term of this patent is extended or adjusted under 35 U.S.C. 154(b) by 948 days.

(21) Appl. No.: 15/160,705

(22) Filed: May 20, 2016

(65) Prior Publication Data
US 2016/0343483 A1  Nov. 24, 2016

Related U.S. Application Data
(60) Provisional application No. 62/164,375, filed on May 20, 2015.

(51) Int. Cl.
*C22C 38/00* (2006.01)
*H01F 10/12* (2006.01)
(52) U.S. Cl.
CPC ......... *C22C 38/002* (2013.01); *H01F 10/126* (2013.01)

(58) Field of Classification Search
CPC ............................ C22C 38/002; H01F 10/126
See application file for complete search history.

(56) References Cited

U.S. PATENT DOCUMENTS

| | | | |
|---|---|---|---|
| 7,952,239 B2 * | 5/2011 | Clark | H01L 41/12 310/26 |
| 8,092,616 B2 * | 1/2012 | Furuya | B22F 9/008 148/104 |
| 2006/0279171 A1 * | 12/2006 | Viehland | H01F 10/126 310/311 |
| 2008/0115864 A1 * | 5/2008 | Flatau | C22C 38/002 148/621 |
| 2008/0203855 A1 * | 8/2008 | Viehland | H01F 10/126 310/357 |
| 2011/0192508 A1 * | 8/2011 | Gao | C21D 8/1233 148/645 |

OTHER PUBLICATIONS

Clark et al., "Extraordinary magnetoelasticity and lattice softening in bcc Fe—Ga alloys," Journal of Applied Physics vol. 93, No. 10, May 15, 2003, 8621-8623. (Year: 2003).*

(Continued)

*Primary Examiner* — Anthony J Zimmer
(74) *Attorney, Agent, or Firm* — Riverside Law LLP

(57) ABSTRACT

The invention relates to non-Joulian magnetostriction (NJM) materials comprising transition metals, such as iron alloy magnets with non-Joulian magnetostriction (NJM). The invention also relates to reversibly linear non-dissipative transition metals magnets. The materials are capable of simultaneously large actuation in longitudinal and transverse directions, without simultaneous heat loss. The invention relates as well to methods of making non-Joulian magnetostriction (NJM) materials.

23 Claims, 25 Drawing Sheets

(56) References Cited

OTHER PUBLICATIONS

Srisukhumbowornchai et al., "Large magnetostriction in directionally solidified FeGa and FeGaAl alloys," Journal of Applied Physics vol. 90, No. 11, Dec. 1, 2001, 5680-5688. (Year: 2001).*
Guruswamy et al., "Strong, ductile, and low-field-magnetostrictive alloys based on Fe—Ga", Scripta Materialia, 43, 239-244, (2000).
Clark et al., "Magnetostrictive properties of body-centered cubic Fe—Ga and Fe—Ga—Al alloys", Magnetics, IEEE Transactions on 36, 3238-3240, (2000).
Rafique et al., "Magnetic anisotropy of FeGa alloys", J. Appl. Phys. 95, 6939-6941, (2004).
Xing et al., "Structural investigations of Fe—Ga alloys: Phase relations and magnetostrictive behavior", Acta Materialia 56, 4536-4546, (2008).
Clark et al., "Extraordinary magnetoelasticity and lattice softening in bcc Fe—Ga alloys", J. Appl. Phys. 93, 8621-8623, (2003).
Pirc et al., "Mesoscopic model of a system possessing both relaxor ferroelectric and relaxor ferromagnetic properties", Physical Review B, 79, 7, (2009).
Fu and Cross, "On the flexoelectric effects in solid dielectrics: Theories and applications", Ferroelectrics 354, 238-245, (2007).
Mudivarthi, Chaitanya et al., "Origin of Magnetostriction in Fe—Ga", Journal of Applied Physics 107, 09A957-1 (2010).
Laver, M. et al., "Magnetostriction and Magnetic Heterogeneities in Iron-Gallium", PRL 105, 027202 (2010).
Chopra and Wuttig, "Non-Joulian Magnetostriction", proceedings MSE Conference, Symposium A03, Darmstadt, Germany, Sep. 23-25. Abstract published Jun. 27, 2014.
Lisfi et al., "The power of torque magnetometry: defect induced switching in hexaferrite nano-structures", Nanotechnology 25, 415702, (2014).

* cited by examiner

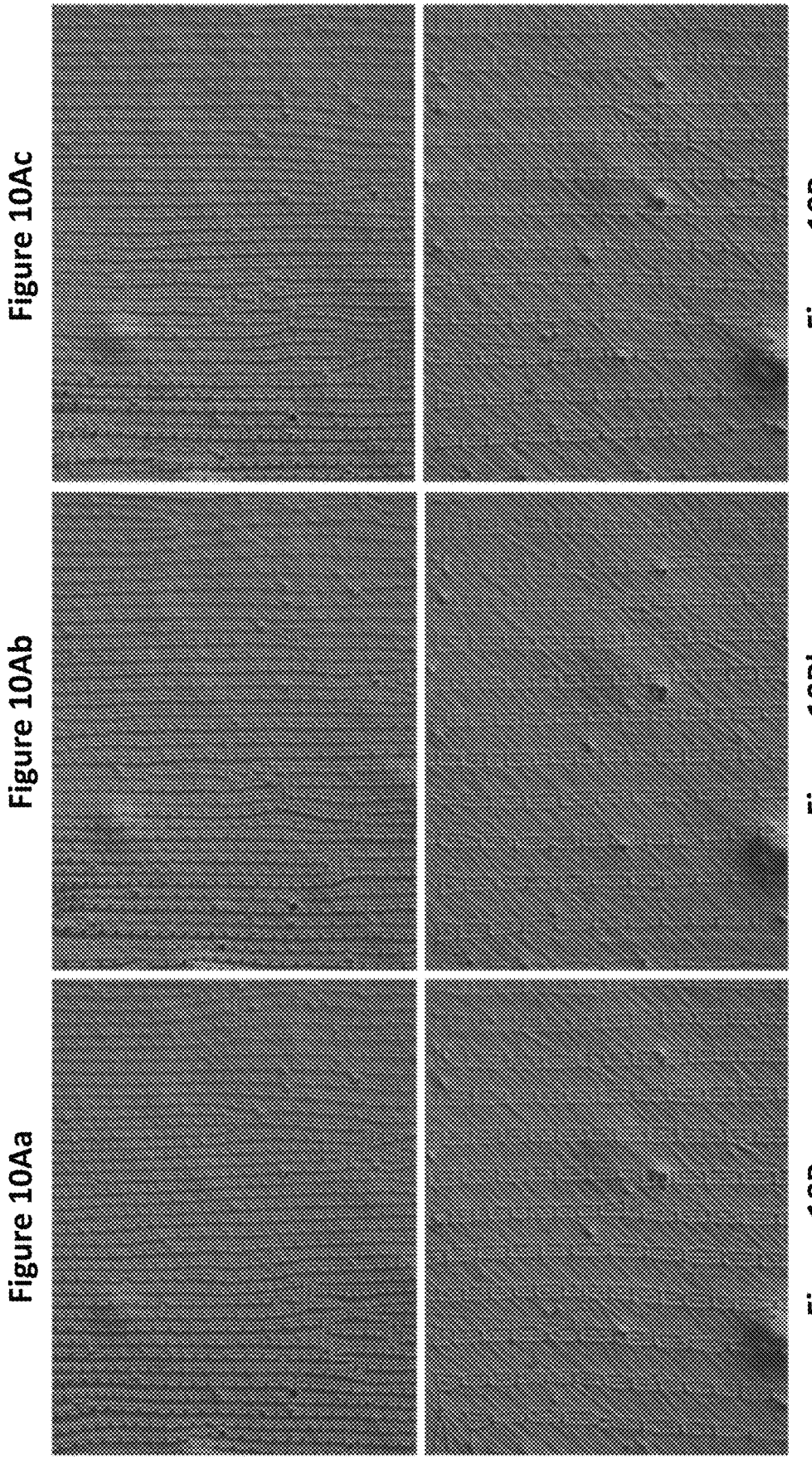

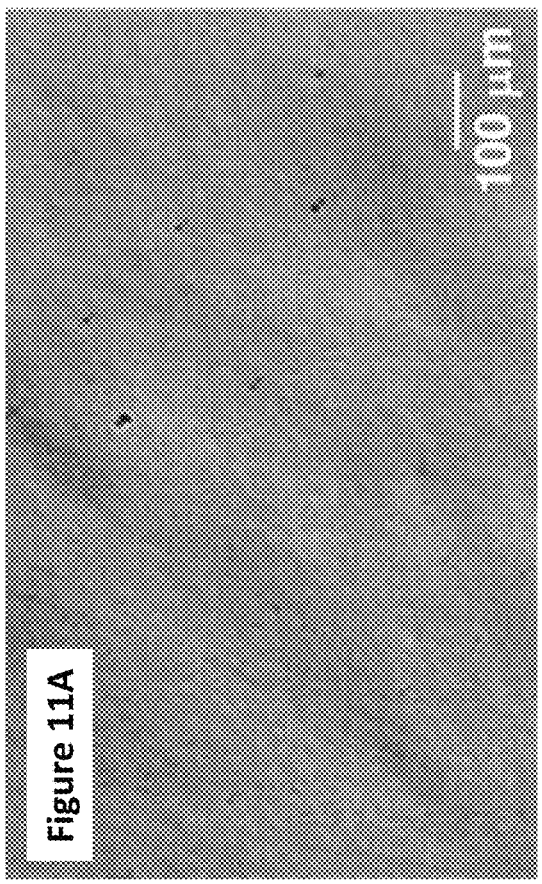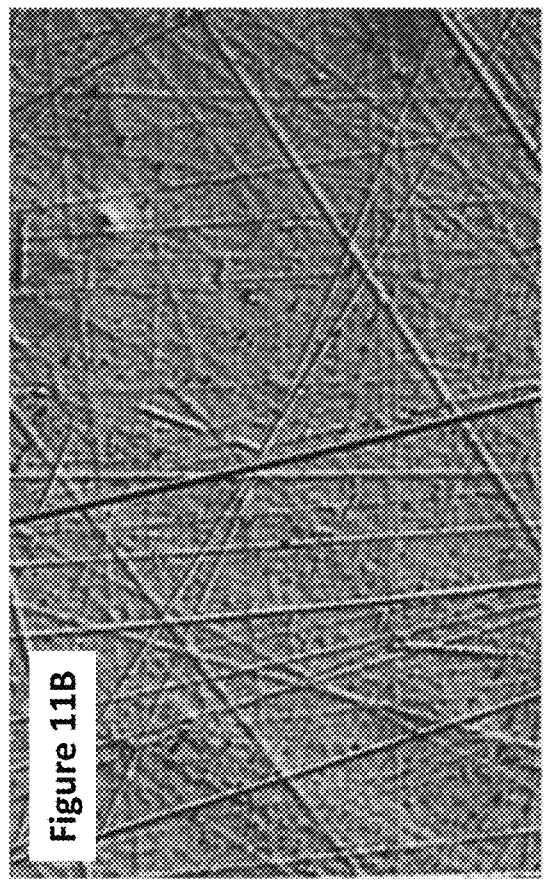

NON-JOULIAN MAGNETOSTRICTIVE MATERIALS AND METHOD OF MAKING THE SAME

CROSS-REFERENCE TO RELATED APPLICATIONS

This application claims priority from U.S. Provisional Patent Application Ser. No. 62/164,375, filed May 20, 2015, the entire contents of which is incorporated herein by reference.

STATEMENT REGARDING FEDERALLY SPONSORED RESEARCH OR DEVELOPMENT

This invention was made with federal government support under Grant Nos. 1541236 and 1206397 awarded by the National Science Foundation. The government has certain rights in the invention.

BACKGROUND OF THE INVENTION

All magnets elongate and contract anisotropically when placed in a magnetic field, an effect referred to as Joule magnetostriction (JM; Joule, On the Effects of Magnetism upon the Dimensions of Iron and Steel Bars. The London, Edinburgh and Dublin philosophical magazine and journal of science. Taylor & Francis 30, Third Series: 76-87, 225-241, 1847). The hallmark of JM is volume conservation (du Trémolet de Lacheisserie et al., Magnetism Fundamentals. Springer, Grenoble Sciences France), which is a broader definition applicable to self-accommodation of ferromagnetic, ferroelectric or ferroelastic domains in all functional or 'smart' materials (Khachaturyan and Shatalov, Theory of macroscopic periodicity for a phase transition in the solid state. Soviet Physics JETP 29, 557-561, 1969; Clark and Belson, Giant Room-temperature magnetostrictions in TBFE2 and DYFE2. Physical Review B 5, 3642-&, doi: 10.1103/PhysRevB.5.3642, 1972; Chopra et al., Domain structures in bent In-22.5 at. % T1 polydomain crystals. Acta Materialia 44, 747-751, doi:http://dx.doi.org/10.1016/1359-6454(95)00183-2, 1996; Roytburd, Thermodynamics of polydomain heterostructures. I. Effect of macrostresses. J. Appl. Phys. 83, 228-238, doi:10.1063/1.366677, 1998; Chopra et al., Magnetic-field-induced twin boundary motion in magnetic shape-memory alloys. Physical Review B 61, 14913-14915, 2000; Sozinov et al., Giant magnetic-field-induced strain in NiMnGa seven-layered martensitic phase. Appl. Phys. Lett. 80, 1746-1748, doi:10.1063/1.1458075, 2002; Ji et al., Adaptive ferroelectric states in systems with low domain wall energy: Tetragonal microdomains. J. Appl. Phys. 94, 3629-3640, doi:10.1063/1.1599632, 2003; Kaufmann et al., Adaptive Modulations of Martensites. Physical Review Letters 104, 145702, 2010).

Whereas the hallmark of JM is volume conservation when placed in magnetic field, this patent describes materials and processing of materials that exhibit non-Joulian magnetostriction (NJM), i.e., magnets that do not conserve their volume when placed in magnetic fields, especially, in fields that are typically used for practical applications (less than 5000 Gauss in absolute magnitude). There is also a continuing need in the art for novel methods for fabricating novel materials exhibiting NJM. The present invention addresses these continuing needs in the art.

SUMMARY OF INVENTION

In one aspect, the invention relates to a material comprising a transition metal, wherein the total volume of the material is capable of changing when the material is placed in a magnetic field. In one embodiment, the transition metal is selected from the group consisting of iron, cobalt, nickel, terbium, and dysprosium. In another embodiment, the material further comprises a group 13 or 14 element. In one embodiment, the group 13 or 14 element is selected from the group consisting of aluminum, gallium, germanium, and silicon. In one embodiment, the transition metal is iron. In one embodiment, the concentration of transition metal in the material is between 60 to 100%. In another embodiment, the concentration of transition metal in the material is between 60 to 99.9%. In one embodiment, the volume change is an increase. In another embodiment, the volume change is a decrease. In one embodiment, the material is a magnet. In another embodiment, the material is ferromagnetic. In one embodiment, the material is a crystalline transition metal alloy of cubic crystal symmetry. In one embodiment, the material comprises about 73.9% iron and about 26.1% gallium. In another embodiment, the material comprises about 82.9% iron and about 17.1% gallium.

In one embodiment, the material is crystalline and the volume change is due to dimensional strains of different relative magnitude along the different directions of the crystalline lattice of the material. In one embodiment, the relative magnitude of the dimensional strains is between 0.1 to 3000 ppm. In another embodiment, the maxima of longitudinal dimensional strain occurs along any crystal direction where longitudinal magnetostriction means measured strain is along applied magnetic fields. In another embodiment, the relative magnitude of the dimensional strains is between 0.1 to 3000 ppm in the transverse directions. In another embodiment, the maxima of transverse dimensional strains could occur along any crystal direction, where transverse magnetostriction means measured strain is perpendicular to the applied magnetic fields. In another embodiment, the maxima of longitudinal dimensional strain occurs along the easy directions of the crystalline lattice.

In one embodiment, the material is crystalline and the volume change is due to dimensional strains of similar relative magnitude along the different directions of the crystalline lattice of the material. In another embodiment, the relative magnitude of the dimensional strains is between 0.1 to 3000 ppm. In another embodiment, the maxima of longitudinal dimensional strain occurs along the easy directions of the crystalline lattice.

In one embodiment, the volume change results in negligible heat loss as the magnet is cycled in magnetic fields. In another embodiment, the material has a crystalline structure and exhibits plane-parallel micromagnetic cellular bands along the <100> type crystal direction. In another embodiment, the cells have nanoscale magnetic gradients within.

In another aspect, the invention relates to an actuator comprising the material of claim 1.

In one aspect, the invention relates to a method of fabricating a material capable of changing its total volume when the material is placed in a magnetic field, comprising: growing a crystal of a material comprising a transition metal; thermally treating the crystal at a temperature between 500 to 1100 K for a period of time; and cooling the crystal to room temperature at a cooling rate between 0.01 to 1000 K/min. In one embodiment, the transition metal is selected from the group consisting of iron, cobalt, nickel, terbium, and dysprosium. In another embodiment, the crystal is a single crystal. In another embodiment, the crystal is polycrystalline. In one embodiment, the thermal treatment is annealing. In another embodiment, the period of time is about 30 min. In another embodiment, the temperature is about 1,033 K. In one embodiment, the cooling rate is about 10 K/min. In another embodiment, the cooling rate is about 100 K/min. In one embodiment, the method further comprises a mechanical manipulation of the crystal.

BRIEF DESCRIPTION OF THE DRAWINGS

The following detailed description of preferred embodiments of the invention will be better understood when read in conjunction with the appended drawings. For the purpose of illustrating the invention, there are shown in the drawings embodiments which are presently preferred. It should be understood, however, that the invention is not limited to the precise arrangements and instrumentalities of the embodiments shown in the drawings.

FIG. 1, comprising FIG. 1A depicts room temperature longitudinal magnetostriction along magnetic easy [100] and hard [110] axes in $Fe_{73.9}$—$Ga_{26.1}$ (expressed in atomic percent). The single crystal was annealed at 1033 K for 30 minutes followed by rapid quenching. FIG. 1B depicts room temperature longitudinal magnetostriction along [100] and [110] axes in $Fe_{82.9}$—$Ga_{17.1}$, annealed at 1033 K for 30 minutes then cooled at 10 K/min. The NJM (blue or green) is shown separated from Joulian magnetostriction (JM; red). FIGS. 1C and 1D depict the positive volume change as a hallmark of NJM for $Fe_{73.9}$—$Ga_{26.1}$ alloy. The overall shapes are shown for the cases of an applied field along [100], FIG. 1C, and along the [110] axis, FIG. 1D.

FIG. 2, comprising FIGS. 2A-C depict room temperature magnetization curves along various in-plane directions of disk shaped samples. M, magnetization; Ms, saturation magnetization. FIG. 2A: Fe—Ga. The [111] direction from a bigger crystal is also shown to emphasize isotropy. FIG. 2B: Fe—Ge, and FIG. 2C: Fe—Al alloys. FIG. 2D is a schematic showing hard axis (linear) and easy axis (hysteretic) magnetization in conventional magnets. The slopes are given by inverse demagnetization factor of the disks.

FIG. 3, comprising FIGS. 3A-3G, 3Ha-3Hd, and 3Ia-3If, is series of photographs and charts depicting self-strain associated with highly periodic cellular micromagnetic structure giving rise to NJM. FIGS. 3Ia-3Ic correspond to increasing fields, and FIGS. 3Id-3If, to decreasing fields. Original magnification is ×5. Respective fields are 0, 206, 393, ~1,000, 198, and 0 Oe.

FIG. 5, comprising

FIG. 9, comprising FIG. 9A depicts the demagnetized state of a thin circular plate. FIG. 9B depicts the demagnetized state of a thin ferromagnetic film, $\lambda_{100}=0$. FIG. 9C depicts the angular distortion of the diagonals for $\lambda_{100}<0$ and $\lambda_{100}>0$. FIG. 9D depicts the stress free rectangular demagnetized state through twinning.

FIG. 10, comprising FIGS. 10Aa-10Ac, and FIGS. 10Ba-10Bc, is a series of photographs depicting the zero-field micromagnetic patterns of as-quenched $Fe_{73.9}$—$Ga_{26.1}$ crystal after cycling in saturation magnetic field. FIGS. 10Aa-10Ac depict low-magnification images. Original magnification is ×10. FIGS. 10Ba-10Bc depict high-magnification images. The pattern's periodicity and scale equals that shown in FIG. 3. Original magnification is ×20.

FIG. 11, comprising FIGS. 11A and 11B, is a series of photographs depicting how polishing can cause deep buried subsurface deformation. FIG. 11A depicts an apparently scratch-free $Fe_{82.9}$—$Ga_{17.1}$ single crystal after polishing but before etching. FIG. 11B depicts that subsequent etching in a 50:50 nitric acid and distilled water solution reveals numerous scratches.

DETAILED DESCRIPTION

Figure 1A:
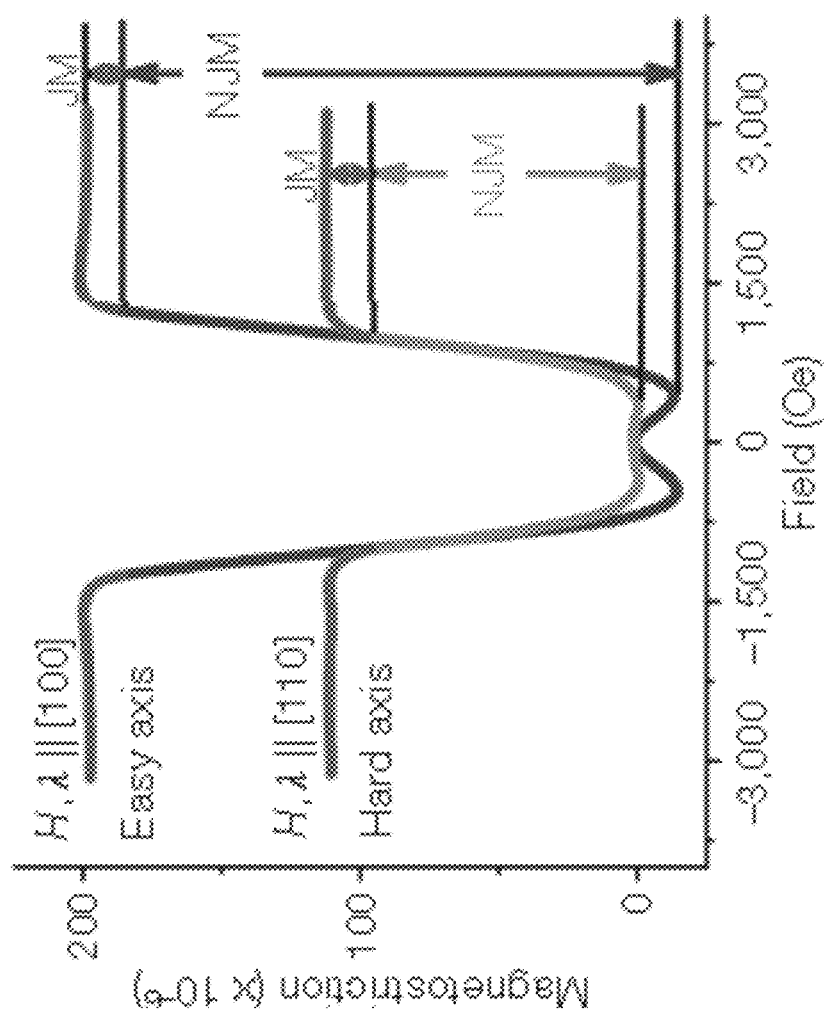
FIGS. 1A-1D, is a series of charts depicting Non-Joulian magnetostriction (NJM).

The invention relates to non-Joulian magnetostriction (NJM) materials comprising transition metals, for example magnets comprising transition metals, further comprising additional elements from groups 13 and 14. The invention also relates to materials, such as magnets, which are reversibly linear non-dissipative. The materials of the invention are capable of simultaneously large actuation in longitudinal and transverse directions, which can be used in various applications as described herein. The invention relates as well to methods of making non-Joulian magnetostriction (NJM) materials comprising transition metals, and applications thereof.

Definitions

It is to be understood that the figures and descriptions of the present invention have been simplified to illustrate elements that are relevant for a clear understanding of the present invention, while eliminating, for the purpose of clarity, many other elements found in the art related to ferromagnetic alloys, methods of making ferromagnetic alloys, applications of ferromagnetic alloys, and the like. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods, materials and components similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, or ±0.1% from the specified value, as such variations are appropriate.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Materials and Devices

In one aspect, the invention relates to non-volume conserving, i.e., non-Joulian, magnetostriction (NJM) materials, in particular NJM alloys of transition metals and one or more elements from groups 13 and 14. In one embodiment, the material is an alloy. As readily apparent, the materials of the invention can be ferromagnetic, in particular reversibly linear non-dissipative iron alloy magnets. Owing in part to the specific fabrication methods described herein, the materials of the invention exhibit the ability of expanding or contracting their volume when placed in a magnetic field, that is, the materials show a positive or negative dimensional change in all directions of the single crystal or polycrystal. Particular materials of the invention show the ability of expanding or contracting volume when placed in a magnetic field without, or with negligible concurrent loss of heat. In some embodiments, the materials of the invention are crystalline and their relative spatial orientation to an external magnetic field can be described referring to the Miller coordinates of the crystalline lattice.

In one aspect, the materials of the invention are crystalline transition metal alloys comprising an element from groups 13 and 14. In one embodiment, the transition metal can be rare earth metals. In one embodiment, the transition metal can be iron, cobalt, nickel, terbium, neodymium, praseodymium, samarium, or dysprosium. In one embodiment, the element from groups 13 and 14 can be aluminum, gallium, germanium, or silicon. The concentration of transition metal in the material can be between 60 to 100%. In one embodiment, the transition metal is iron at a concentration of about 73.9 at % iron, while in another embodiment, the transition metal is iron at a concentration of about 82.9 at % iron. In one embodiment, the material comprises about 73.9% iron and about 26.1% gallium. In another embodiment, the material comprises about 82.9% iron and about 17.1% gallium. In some embodiments the materials are magnetic, for example ferromagnetic, and in other embodiments the materials are crystalline iron alloys of cubic crystal symmetry.

Described herein in relative units, the materials of the invention exhibit generally expansion or contraction strains between 0.1 to 3000 parts per million (ppm) in any direction. In other embodiments, the alloys may exhibit contraction to decrease its volume when placed in magnetic fields with dimensional changes of similar magnitude in absolute value. In some embodiments, when placed in a magnetic field, the materials of the invention exhibit strains of different magnitude along the various coordinates of the crystalline lattice of the material. As readily apparent, the strain can be described relative to the orientation of the applied magnetic field and the Miller coordinates of the crystalline lattice. As readily apparent, it should be appreciated that the materials of the invention can expand or contract when placed in a magnetic field not only as described relative to the coordinates of the crystalline lattice, but rather along any dimension in the three dimensional space.

In another embodiment, the maxima of longitudinal dimensional strain could occur along any crystal direction, where longitudinal magnetostriction means measured strain is along applied magnetic fields. In the same or another embodiment, the relative magnitude of the dimensional strains is between 0.1 to 3000 ppm in the transverse directions. In another embodiment, the maxima of transverse dimensional strains could occur along any crystal direction, where transverse magnetostriction means measured strain is perpendicular to the applied magnetic fields.

In one embodiment, a material of the invention produces a longitudinal magnetostriction expansion strain of about 200 ppm when the applied magnetic field is along the [100] direction In another embodiment, a material of the invention produces a magnetostriction expansion strain of about 100 ppm when the field is along the [110] direction. In one embodiment, measurement of magnetostriction in fields parallel to the [100] direction evidence angular dependence of the resulting deformation as positive in all directions. In other embodiments, a material of the invention produces a transverse magnetostriction strain along [010] of about 16 ppm in fields parallel to the [100] direction.

In some embodiments, when placed in a magnetic field, a material of the invention exhibits strains of similar magnitude in all directions of the space relative to the crystalline lattice of the material. In some embodiments, the strains are between 0.1 to 3000 ppm. In one embodiment, measurement of magnetostriction of a material of the invention in fields parallel to the [110] direction shows net expansion in all directions. In another embodiment the measurement of magnetostriction may exhibit net contraction in all directions. In other embodiments, measurement of magnetostriction of a material of the invention in fields parallel to the [110] shows longitudinal and transverse strains of about 110-120 ppm, and strain along [100] of about 130 ppm.

In some embodiments, the maxima of longitudinal magnetostriction occurs along the easy directions [100] and [010]. In some embodiments, when placed in a magnetic field, a material of the invention exhibits a strain of about 1.3 ppm normal to a disc made of a material of the invention when the field is directed parallel to the [110 axis], while its longitudinal and transverse magnetostriction strains are about 70 ppm and 62 ppm, respectively, and the strain along [100] is about 89 ppm. In some embodiments, when placed in a magnetic field, a material of the invention exhibits a strain of about 1 ppm when the field is directed along the [100] axis.

In some embodiments, the materials of the invention have cubic crystal symmetry. In other embodiments, the materials are body center cubic (bcc) Fe-rich non-Joulian magnets. The materials of the invention exhibit magnetic characteristics such as reversibility, linearity, non-hysteretic curves resembling rotation. In some embodiments, these characteristics are identical in all crystallographic orientations. In other embodiments, the materials of the invention exhibit a cellular magnetic structure. In some embodiments, the cellular magnetic structure is responsible for NJM. In other embodiments, the cellular magnetic structure exhibits periodicity, i.e., large coherence length, along the vertical [010] and the horizontal [100] directions.

In other embodiments, the materials of the invention exhibit microscopic-scale structural heterogeneity in the form of plane-parallel micromagnetic cellular bands along the <100> type crystal direction. In other embodiments, the materials of the invention spontaneously exists in a folded state. In some embodiments, the folded structure is of crystallographic origin. In some embodiments, the folded structure can be progressively 'unfolded' by applying magnetic fields of increasing strength.

In one embodiment, the materials of the invention are incorporated into a device. In another embodiment, the device is an actuator.

Methods

In one aspect, the invention relates to a method of fabricating the materials of the invention. The method includes growing crystals, and in other embodiments the method further comprises a mechanical manipulation of the crystal, such as cutting a slice from a bulk crystal. The crystal is typically of iron and of an element from groups 13 and 14. The crystal is thereafter submitted to a thermal treatment. As readily apparent, the thermal treatment may include any or all of the steps of heating, annealing, case hardening, precipitation strengthening, tempering, normalizing and quenching.

Figure 13:
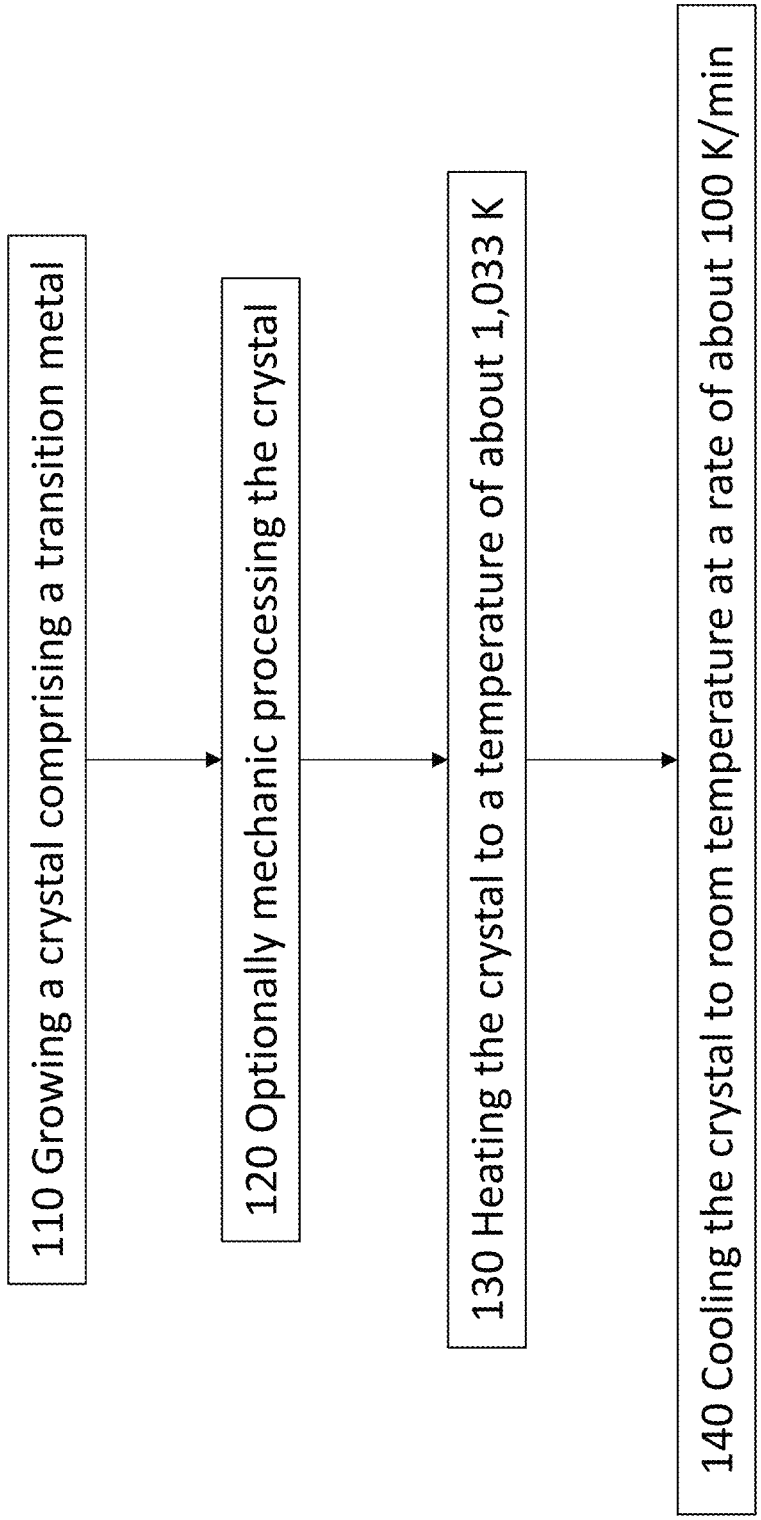
FIG. 13 is a flow chart depicting an exemplary method of fabricating the materials of the invention.

Referring now to FIG. 13, an exemplary method of the invention includes a step 110 of growing a crystal comprising a transition metal. In some embodiments, the materials of the invention comprise ferromagnetic crystals, for example single crystals or polycrystals. As readily apparent, crystals can be grown by any suitable method known in the art. In some embodiments the crystals comprise Fe—Ga, Fe—Ge, Fe—Si, and/or Fe—Al alloys. Single crystals can for example be first grown into boules, balls, or spheres.

Referring further to FIG. 13, an exemplary method of the invention includes a step 120 of optionally mechanic processing the crystal. A boule can for example be further cut into slabs of materials of different shape and sizes. In one embodiment, boules can be cut into substantially circular discs of material. In some embodiments, a disc of material can have any appropriate size for the intended application. In one embodiment, a circular disk is about 5 mm in diameter and about 0.4-0.5 mm thick. In one embodiment, the crystallographic [001] direction is normal to the disk plane. In other embodiments the samples can be of any dimensions.

Referring further to FIG. 13, an exemplary method of the invention includes a step 130 of heating the crystal to a temperature of about 1,033 K. As readily apparent, any suitable temperature can be used. In some embodiments, the temperature is between 500 and 1100 K. In some embodiments the thermal treatment includes annealing the material at about 1,033 K. The annealing can be done for any suitable period of time. In one embodiment, the duration of annealing is about 30 min. The thermal treatment further includes a quenching step Referring further to FIG. 13, an exemplary method of the invention includes a step 140 of cooling the crystal to room temperature at a rate of about 100 K/min. As readily apparent, any suitable cooling rate can be used. In another embodiment, fast cooling includes lowering the temperature at a rate of about 100 K/min. In one embodiment, the cooling of the crystal to room temperature is at a cooling rate between 0.01 to 1000 K/min. In one embodiment, the cooling rate is about 10 K/min. In another embodiment, the cooling rate is about 100 K/min.

EXPERIMENTAL EXAMPLES

The invention is further described in detail by reference to the following experimental examples. These examples are provided for purposes of illustration only, and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the compositions of the present invention and practice the claimed methods. The following working examples therefore, specifically point out the preferred embodiments of the present invention, and are not to be construed as limiting in any way the remainder of the disclosure.

Herein is reported the discovery of 'giant' non-volume conserving (non-Joulian) magnetostriction that is unlike any seen so far in any magnet. While Joulian strain is caused by magnetization rotation, non-Joulian magnetostriction NJM is caused by facile (low-field) reorientation of magnetoelastically and magnetostatically autarkic (self-sufficient) rigid micro 'cells,' which defines the adaptive structure, whose origin is proposed to be elastic gradients ultimately caused by charge/spin density waves (Grüner, Density Waves in Solids. Perseus Publishing, 2000; Grüner, The Dynamics of Charge-density waves. Rev. Mod. Phys. 60, 1129-1182, doi:10.1103/RevModPhys.60.1129, 1988; Chopra and Wuttig, Non-Joulian Magnetostriction (poster and abstract), proceedings MSE Conference, Symposium A03, Darmstadt, Germany, Sep. 23-25, 2014).

The equilibrium adaptive cellular structure is responsible for long sought non-dissipative (hysteresis-free), linearly reversible and isotropic magnetization curves along all directions within a single crystal. Recently discovered Fe-based high magnetostriction alloys (Guruswamy et al., Strong, ductile, and low-field-magnetostrictive alloys based on Fe—Ga. Scripta Materialia 43, 239-244, doi:http://dx.doi.org/10.1016/S1359-6462(00)00397-3, 2000; Clark et al., Magnetostrictive properties of body-centered cubic Fe—Ga and Fe—Ga—Al alloys. Magnetics, IEEE Transactions on 36, 3238-3240, doi:10.1109/20.908752, 2000), with special thermal history are identified as first members of this newly discovered magnetic class. Discovery of NJM paradigm provides consistent interpretation of seemingly confounding properties of Fe-based alloys, offers recipes to develop new highly magnetostriction materials, and permits simultaneously large actuation in longitudinal and transverse directions without need for stacked composites.

Figure 3C:
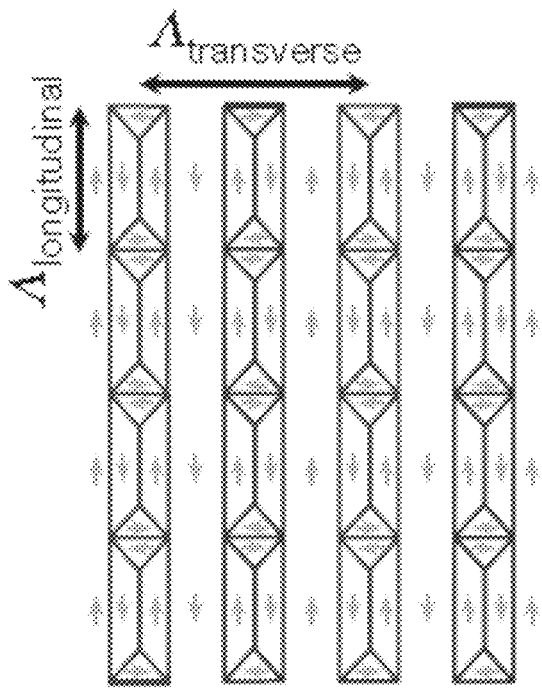
FIG. 3C is a schematic of micromagnetic structure.
Figure 3D:
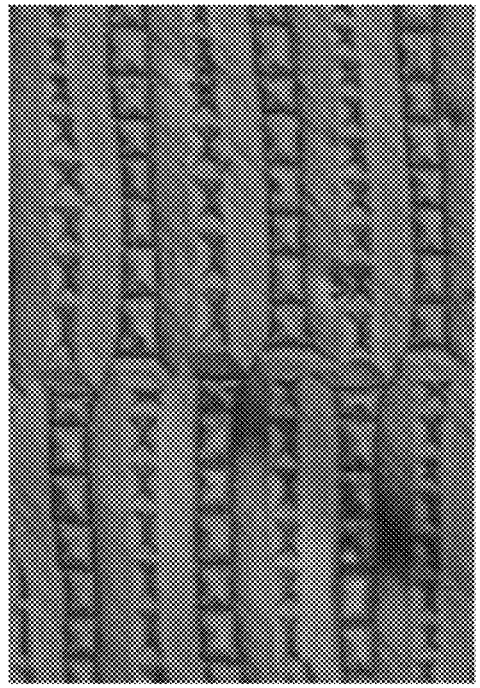
FIG. 3D depicts formation of anti-phase boundaries (APB) caused by vertical displacement of periodic structure by $\frac{1}{2}\Lambda_{Transverse}$. Original magnification is ×10.
Figure 3A:
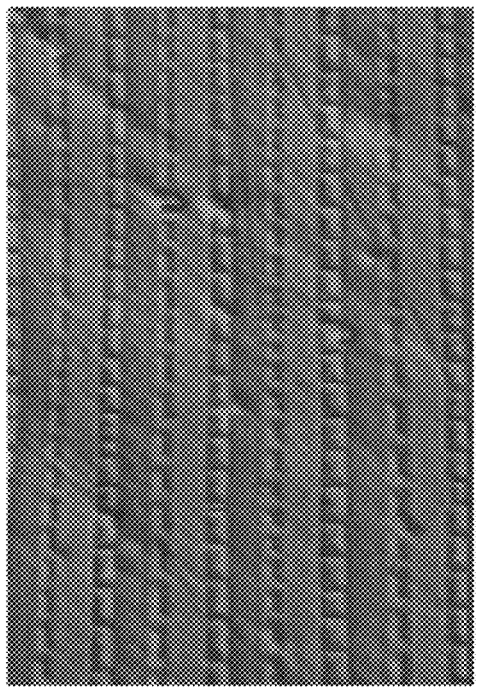
FIGS. 3A and 3B depict low- and medium-magnification micromagnetic images in quenched $Fe_{73.9}$—$Ga_{26.1}$ crystal. The highly periodic longitudinal and transverse cellular pattern of 43 μm and ~12-14 μm, respectively, obviates the need for scale bars. Original magnifications are ×10 and ×50, respectively.
Figure 3B:
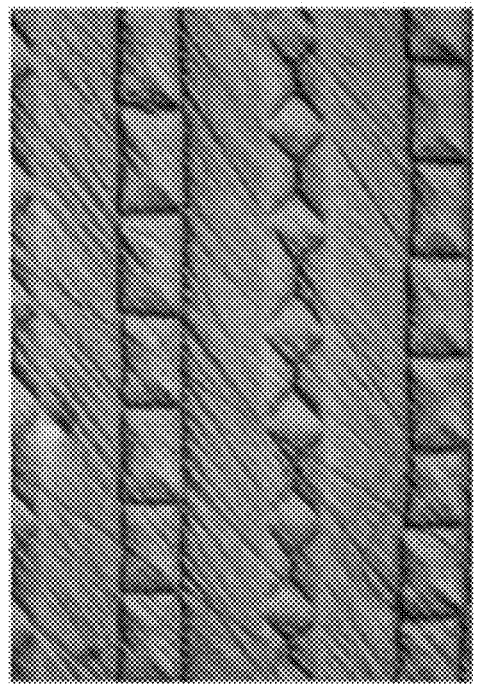
Figure 3G:
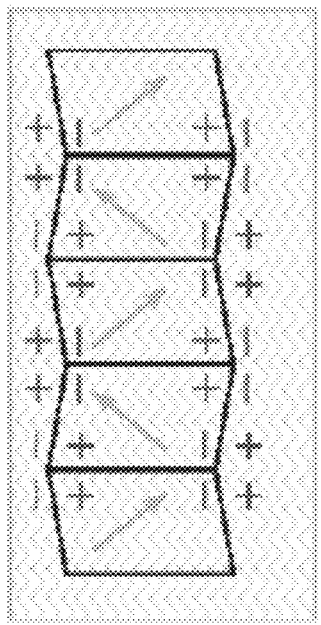
FIG. 3G is a schematic depicting the analysis based on magnetostriction mismatch showing that average stress at nodes is zero.
Figure 3E:
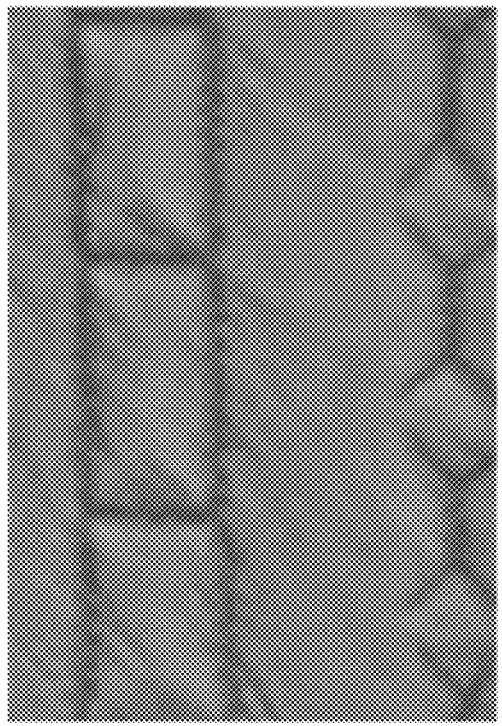
FIG. 3E depicts a zoomed-in high-magnification image revealing that walls are zigzagged and not straight segments. Original magnification is ×50.
Figure 3F:
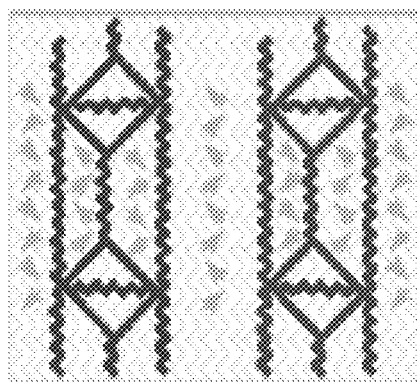
FIG. 3F is a corresponding schematic in which the direction of zigzagged magnetization vectors is highly exaggerated.

FIGS. 1, 2 and 3 represent the core of the experimental results. FIG. 1 shows NJM of two Fe—Ga single crystals with widely different compositions and thermal treatments; FIG. 2 shows the unusual characteristics of isotropic and non-hysteretic magnetization curves in Fe—Ga, Fe—Al and Fe—Ge single crystals; and FIG. 3 shows the cellular microstructure of Fe—Ga central to the interpretation of our results. FIG. 4 summarizes the rule of mixture governing the magnitude of NJM in various directions.

Materials and Methods
Single Crystals

All single crystals in this study (Fe—Ga, Fe—Ge and Fe—Al) were cut from boules grown at Ames laboratory into circular disks ~5 mm in diameter and 0.4-0.5 mm thick. The crystallographic [001] direction is normal to the disk plane.

Surface Preparation for Micromagnetic and Optical Studies

It is not commonly appreciated that the lower the anisotropy (especially when anisotropy is of purely magnetoelastic origin), the harder it is to develop the micromagnetic pattern by surface polishing. Given the delicate nature of the patterns, their long (~mm) coherence length and the exceptional shear softness of the alloys, great care was taken in surface preparation and sample handling. Key precautions are as follows. Even a soft polishing cloth can lead to deep buried subsurface deformation, which upon etching (50:50 nitric acid and distilled water solution) reveals itself and destroys any subsequent pattern (compare with FIGS. 11A and 11B). Use of tweezers to hold the samples can create long range subsurface deformation. Samples were manipulated by placing them on soft tissues for transferring onto surfaces. Although colloidal silica (0.05 μm is generally recommended for polishing soft materials, it tends to agglomerate and leave deep polishing marks; similar agglomeration problems as with colloidal silica were encountered if finer alumina (0.05 μm) was used as the last polishing step. The 0.3 μm alumina was found to be optimum as the last polishing step. The contrast associated with surface relief of the pattern is weak (barely visible in bright-field microscopy). Hence the differential interference contrast (DIC) mode of the microscope was used for observations. Additionally, image background was subtracted to enhance contrast.

Micromagnetic and Optical Studies

The magnetic domain structure was studied using the high-resolution interference contrast colloid (ICC) method, which is described in detail in several previous publications (Chopra et al., Magnetic-field-induced twin boundary motion in magnetic shape-memory alloys. Physical Review B 61, 14913-14915, 2000; Sullivan and Chopra, Temperature- and field-dependent evolution of micromagnetic structure in ferromagnetic shape-memory alloys. Physical Review B 70, 094427, 2004). Briefly, the ICC method employs a colloidal solution to decorate the microfield on the surface of a ferromagnet, similar to the versatile Bitter method. However, the technique differs in the manner in which the colloid decorated microfield is detected. In the Bitter method, a problem in contrast develops in the bright-field or the dark-field mode due to backscattering by particles and various surfaces between the objective lens and the specimen, resulting in an overall loss of resolution. Instead, the ICC method uses a Nomarski interferometer to detect the surface microfield distribution. The magnetic microfield on the surface causes local variation in the density of colloid particles (average colloid particle size 7 nm), thereby delineating the domain structure. This microfield is detected in the reflection mode by the interferometer optics, which detects any unevenness at the nanometer scale and reveals domain structures with a pronounced three-dimensional effect and at a high resolution that is limited only by that of the microscope (0.4-0.6 μm). The system for imaging magnetic domains is fully automated and interfaced with an image frame grabber and a high-speed data acquisition card. Fields were measured by a Hall probe sitting underneath the sample, and tend to underreport slightly (estimated).

Magnetic Measurements

Magnetostriction was measured on 5 mm Fe—Ga disks by strain gauges from Omega (KFG-2N-120-C1-11L1M2R, Linear, gauge length 2.0 mm, discontinued model) and Vishay (C2A-XX-062LT-120, Tee Rosette, gauge length 1.52 mm; WK-XX-030WT-120, Tee Rosette, gauge length 0.76 mm) using the Wheatstone bridge. Various gauge lengths were used (0.76 mm, 1.52 mm, 2 mm) to confirm the measurements (Sullivan, Wheatstone bridge technique for magnetostriction measurements. Review of Scientific Instruments 51, 382-383, doi:http://dx.doi.org/10.1063/1.1136225, 1980; Lisfi et al., Nano-magnetism of magnetostriction in Fe35Co65. Appl. Phys. Lett. 104, 092401, doi: http://dx.doi.org/10.1063/1.4866183, 2014). Tests were also made on reference nickel samples to confirm measurement protocols. The highly compliant strain gauges do not impede the evolution of magnetostriction strains. The unbalance signal of a Stanford Research Model 810 DSP amplifier provided the strain.

Example 1

Non-Joulian Magnetostriction (NJM)

Single crystals of Fe—Ga, Fe—Ge and Fe—Al were in the form of circular disks ~5 mm in diameter and 0.4-0.5 mm thick, with [001] direction normal to the disk plane. Magnetization curves were measured at room temperature using a vibrating sample magnetometer. The magnetostriction measurements were made by the standard strain gauge method. The magnetic domain structure was studied using the high-resolution interference contrast colloid (ICC) method, which has been described in detail previously (Chopra et al., Magnetic-field-induced twin boundary motion in magnetic shape-memory alloys. Physical Review B 61, 14913-14915, 2000; Sullivan and Chopra, Temperature- and field-dependent evolution of micromagnetic structure in ferromagnetic shape-memory alloys. Physical Review B 70, 094427, 2004).

Figure 1B:
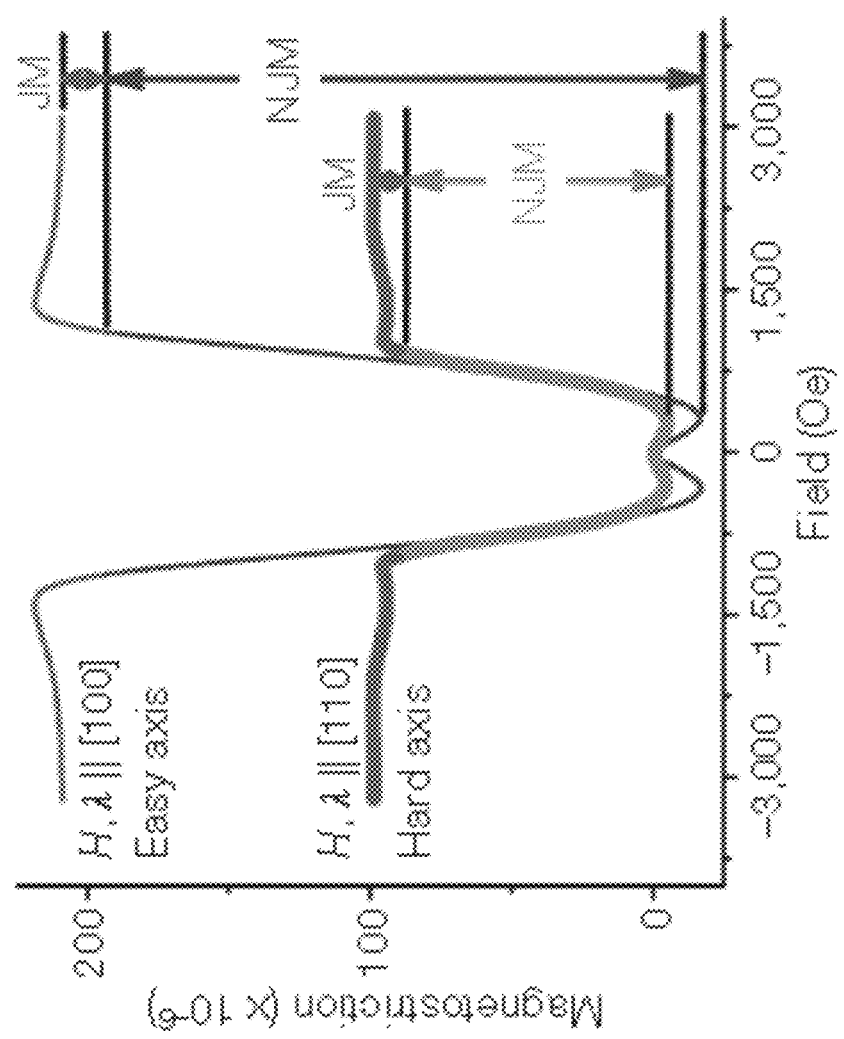
Figure 1C:
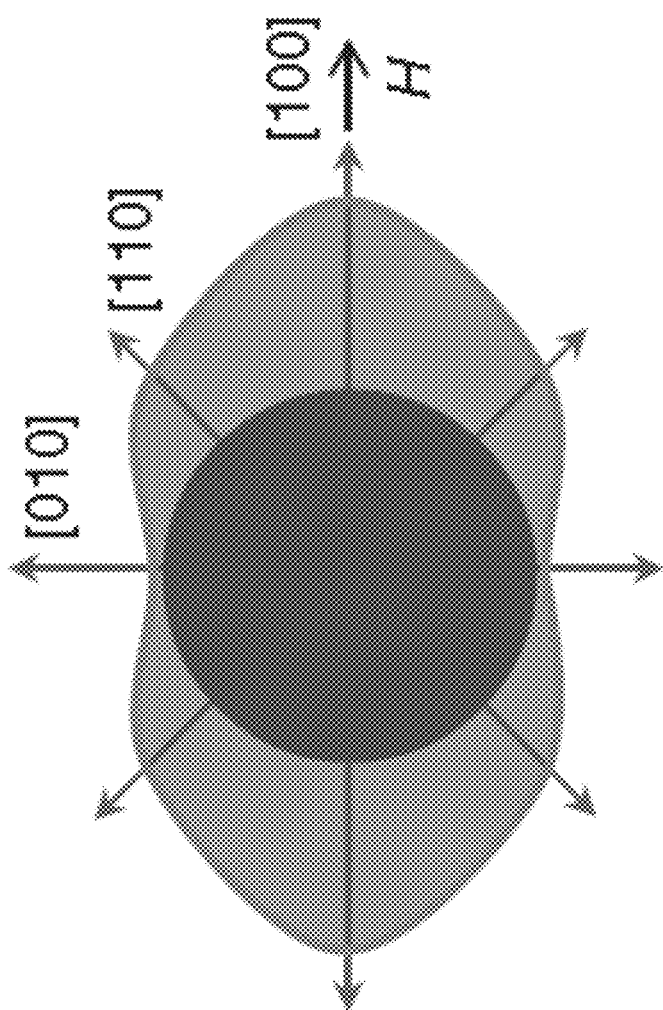
Figure 1D:
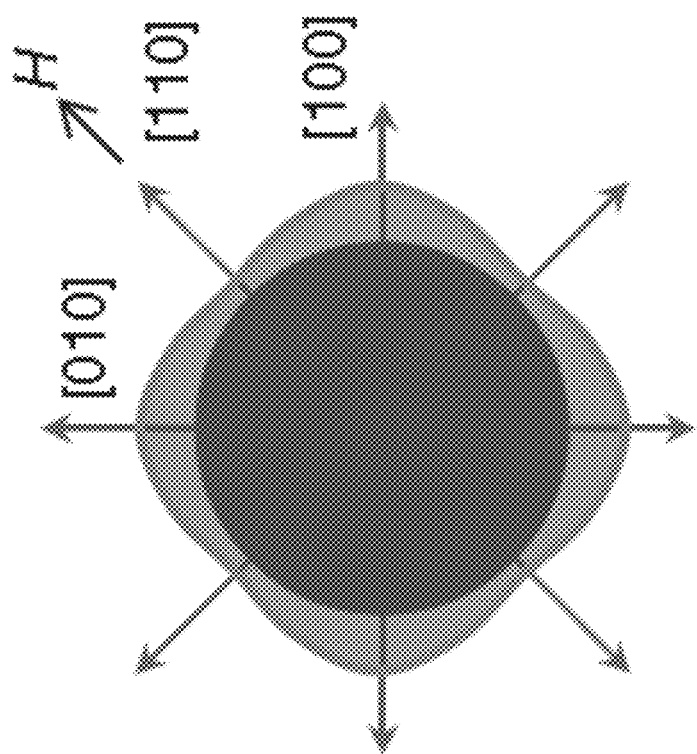
Figure 2A:
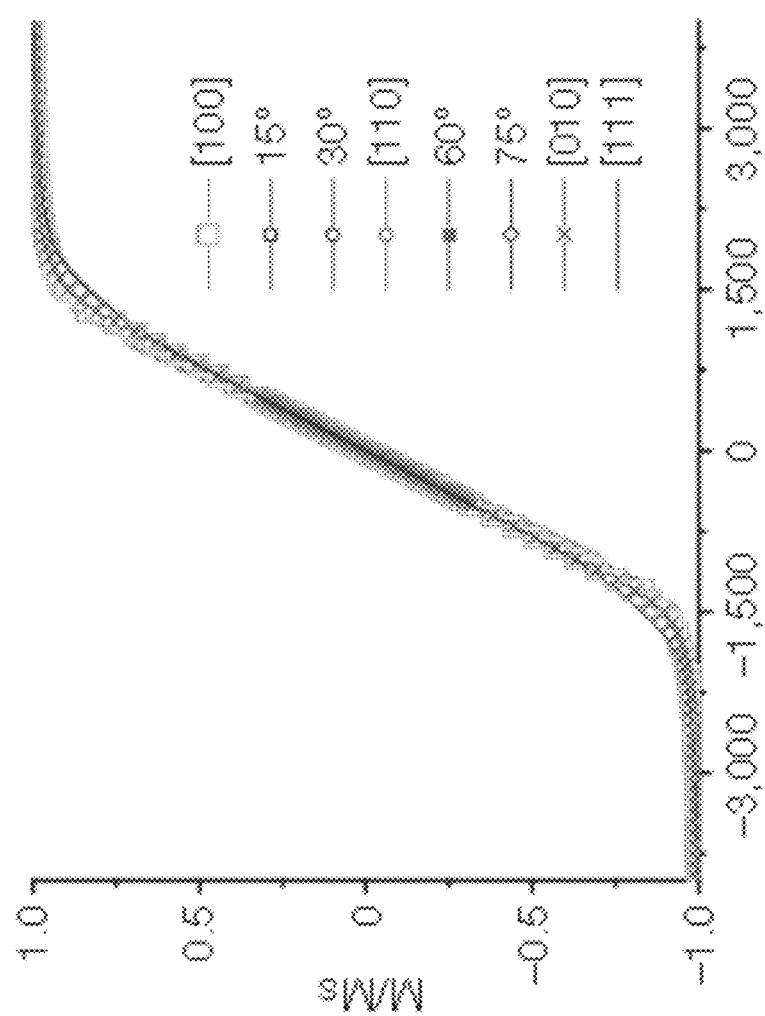
FIGS. 2A-2D, is a series of charts depicting hysteresis-free, linearly reversible and isotropic magnetism.
Figure 2B:
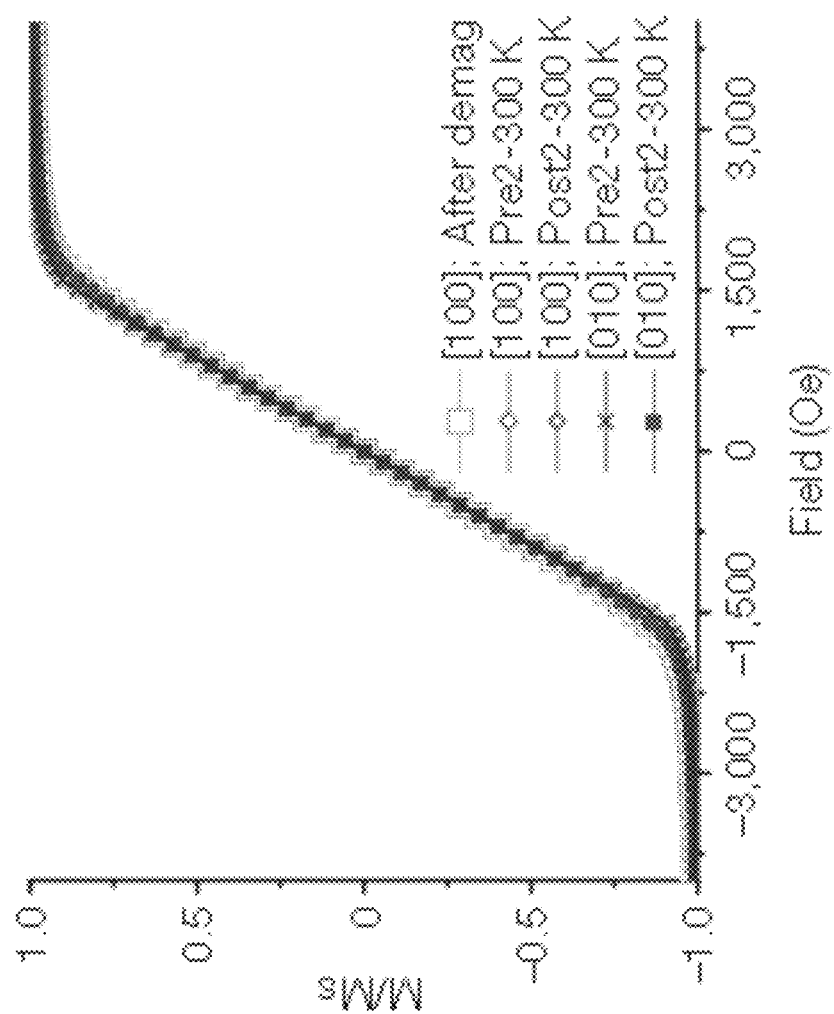
Figure 2C:
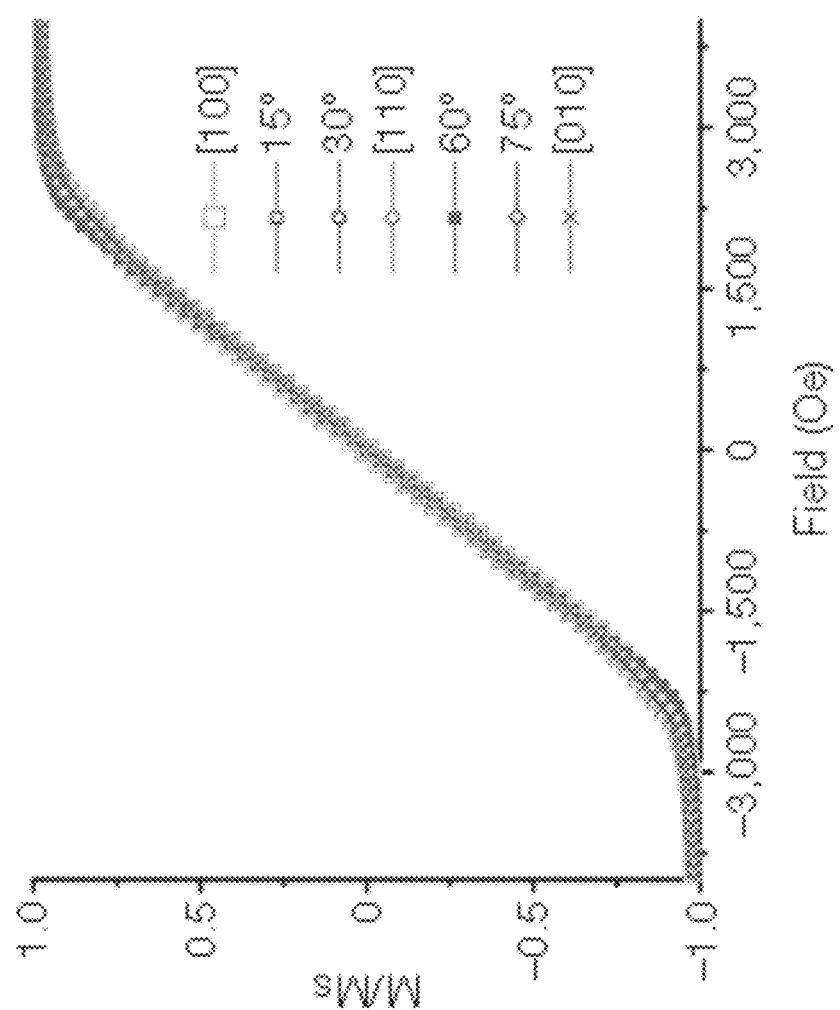
Figure 2D:
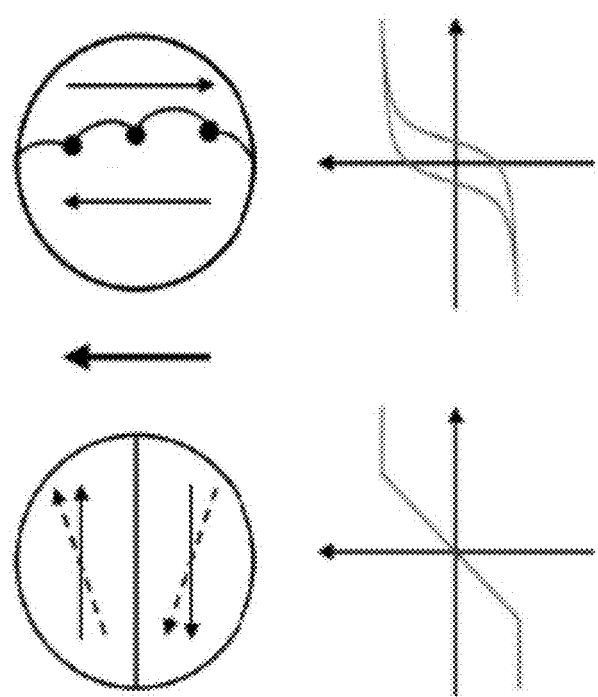
Figure 6:
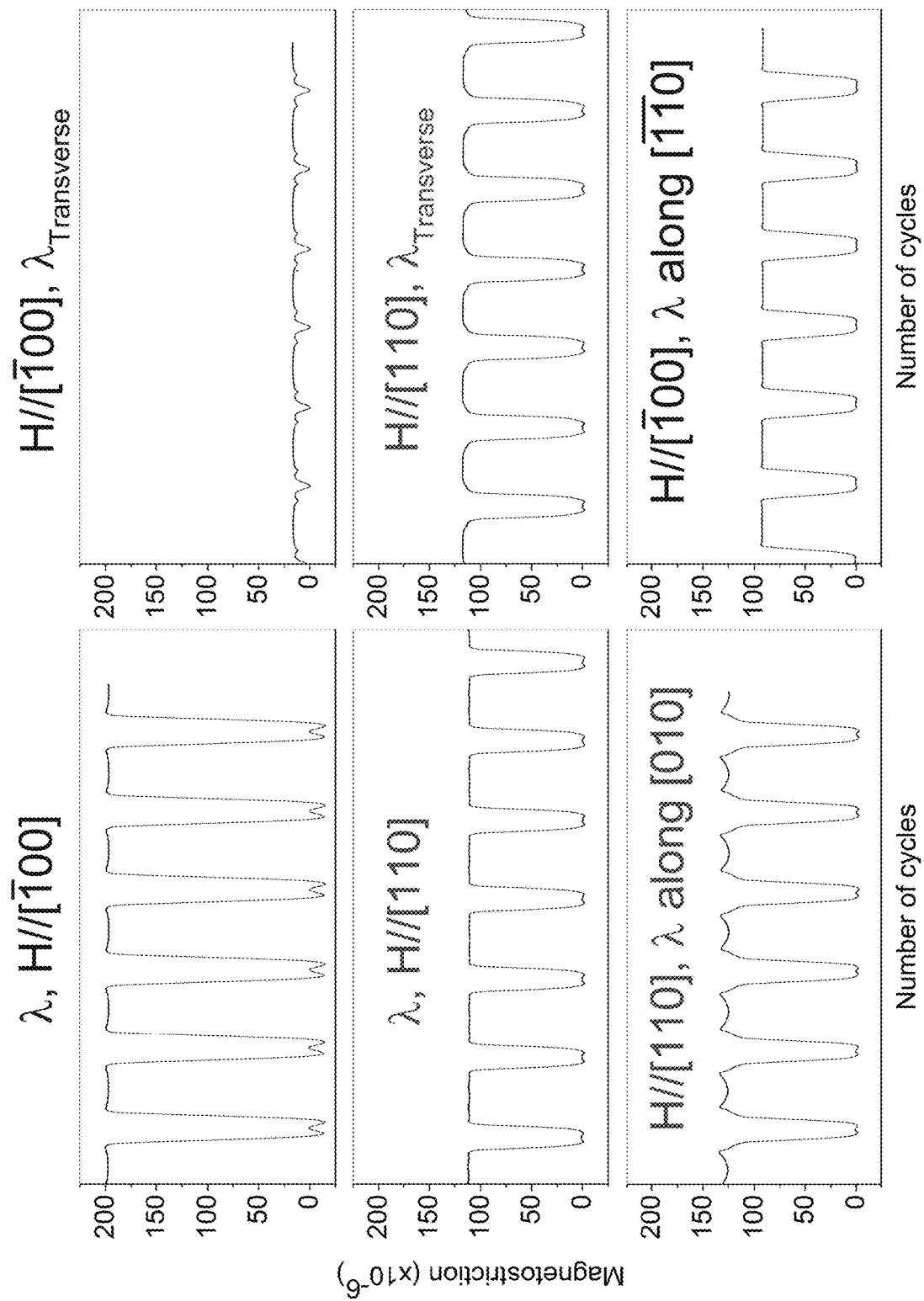
FIG. 6 comprises a series of charts depicting the reproducibility of magnetostriction curves. Reproducibility is shown for various traces in FIG. 1A and traces in FIG. 5. Maximum field for each cycle is approximately ±3,150 Oe. Similarly reproducible traces were observed for the $Fe_{82.9}$—$Ga_{17.1}$ single crystal in FIG. 1B (not shown).
Figure 7:
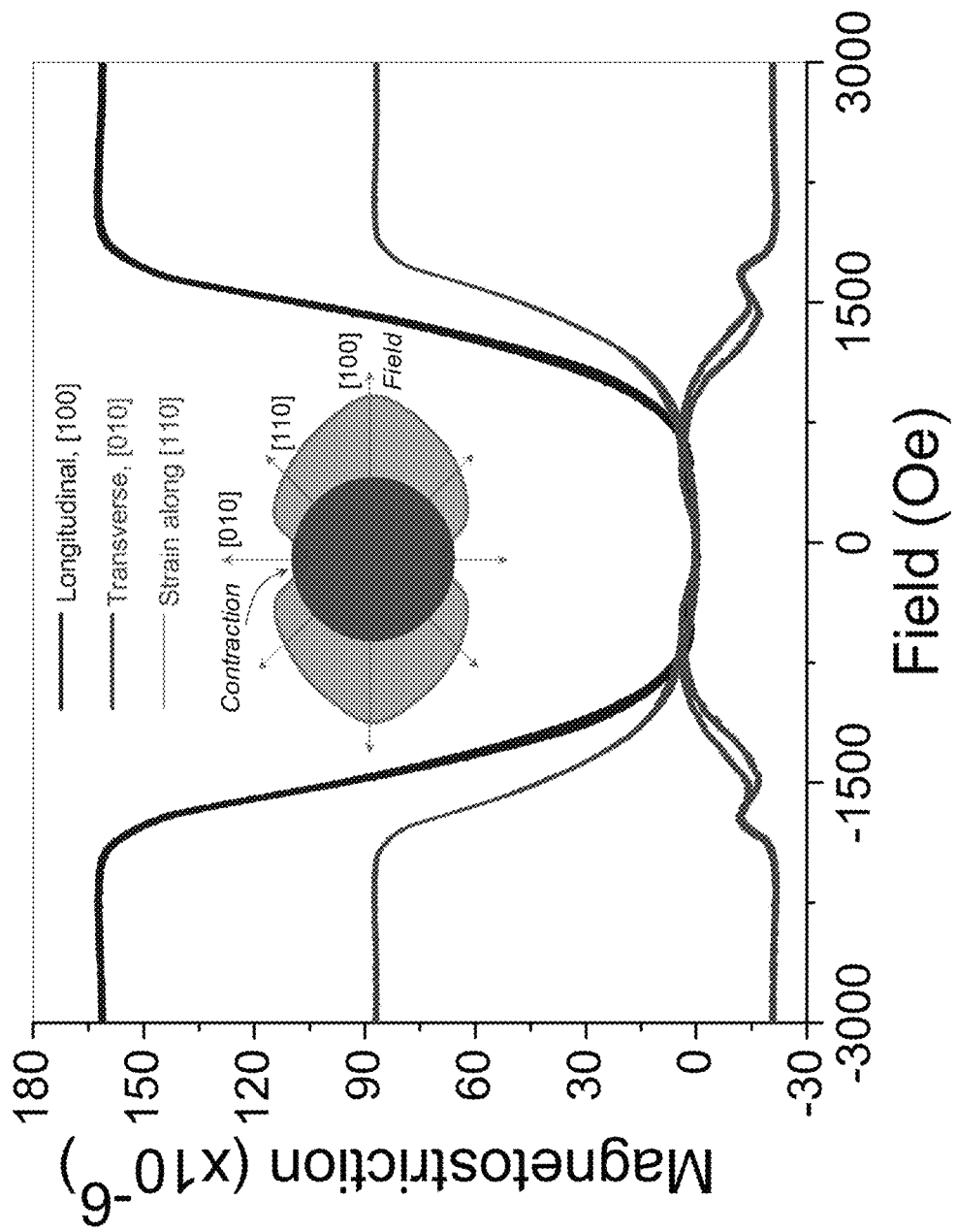
FIG. 7 is a series of charts depicting the degradation of NJM characteristics in $Fe_{73.9}$—$Ga_{26.1}$ single crystal when cooled slowly from 1,033 K to room temperature (furnace cooled). In comparison to volume expansion in all directions when an alloy of this composition was rapidly quenched (FIG. 1A), furnace (slow) cooling cause transverse magnetostriction to become slightly contractile. However, unlike conventional ferromagnets, the sample still exhibits a net volume increase, that is, NJM.

The characteristic features of NJM are illustrated in FIGS. 1A and 1B for $Fe_{73.9}$—$Ga_{26.1}$ and $Fe_{82.9}$—$Ga_{17.1}$ single crystals, respectively. Both alloys produce a large longitudinal magnetostriction expansion strain of ~200 ppm when the applied field is along the [100] direction, and ~100 ppm of longitudinal strain when the field is along the [110] direction. Measurement of magnetostriction along various directions show in fields H∥[100], the angular dependence of the resulting deformation is positive in all directions, as shown in FIG. 1C for the $Fe_{73.9}$—$Ga_{26.1}$ alloy. In other words, the sample expands in all directions and increases its volume, that is, displays NJM. FIG. 1C shows that the deformed state of the initially circular disk possesses uniaxial symmetry. The transverse strain along [010] is small but positive (16 ppm) and the simultaneous expansion along [110]-type directions equals 100 ppm. If, on the other hand, H∥[110], experiments again yield net expansion in all directions but now the deformation displays four-fold symmetry (FIG. 1D). In this case, both the longitudinal and transverse strains are ~110-120 ppm, and strain along [100] equals 130 ppm. The magnetostriction in FIGS. 1C and 1D is shown highly exaggerated relative to the initial circular shape but the relative dimensional changes are to scale. Various longitudinal and transverse magnetostriction curves in the plane of the disk are shown in FIG. 5, data thereafter used to construct FIGS. 1C and 1D. Although not shown, similar behavior is observed for the $Fe_{82.9}$—$Ga_{17.1}$ alloy in FIG. 1B. Magnetostriction curves were highly reproducible over repeated measurements (FIG. 6, corresponding to various curves shown in FIG. 1A and FIG. 5). In addition, a subset of curves was independently measured yielding similar results. The magnitude of longitudinal magnetostriction constitutes the second anomaly; its maxima occurs along the easy directions, [100] and [010], and not along the hard directions of the [110] type (FIGS. 1A and 1B), just the opposite to conventional ferromagnets. This unusual behavior is explained on the basis of rule of mixture for cells whose orientation can only be directed along [100] and [010] (FIG. 4). The observation of NJM is sensitive to previous heat treatment. For instance, when the temperature of a crystal whose composition was similar to the one shown in FIG. 1A was lowered from 1,033 K to room temperature in a furnace (instead of fast cooling), its NJM characteristics degraded (FIG. 7).

Figure 12:
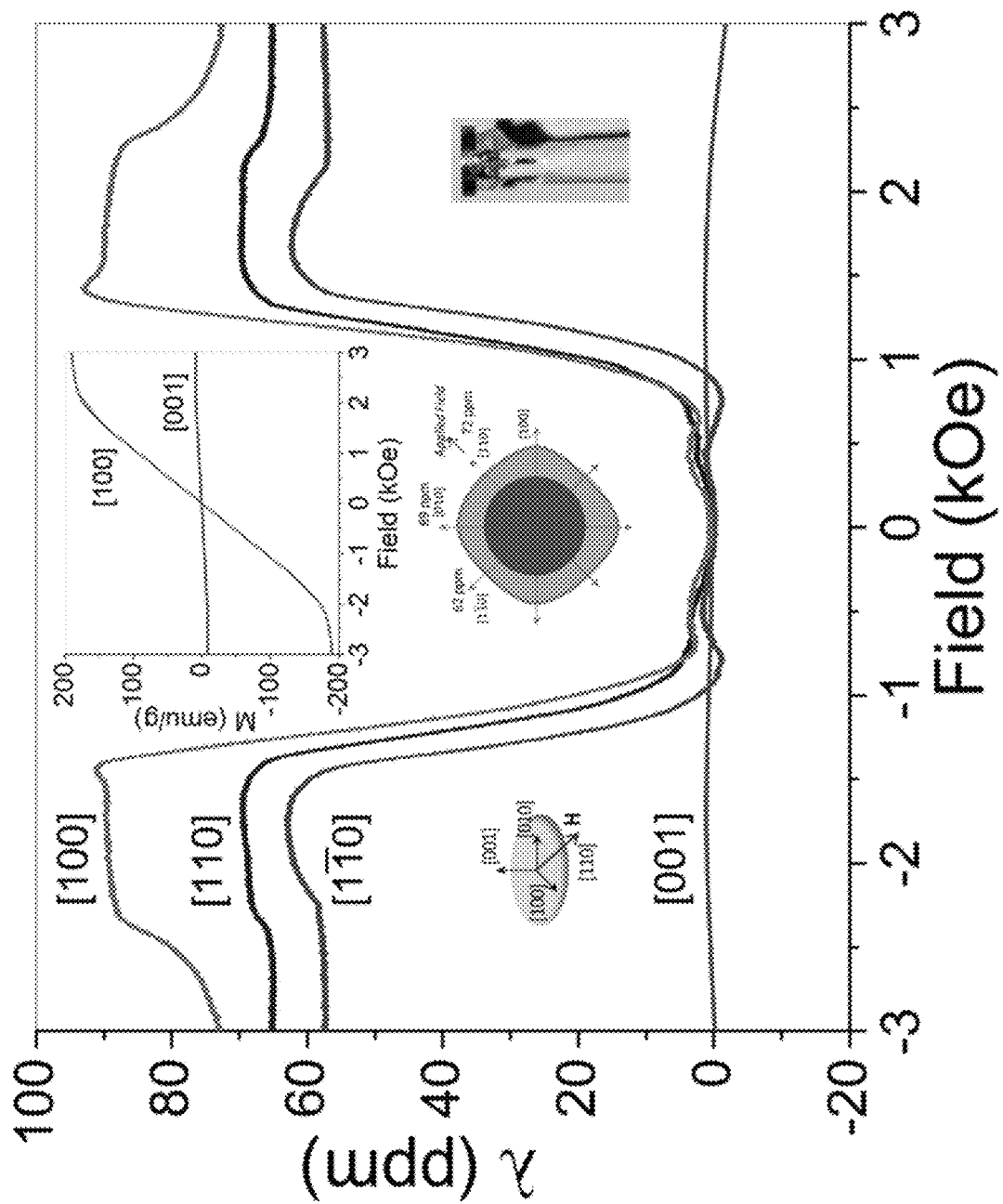
FIG. 12 is a series of charts and images depicting that volume is not conserved in NJM. Room-temperature magnetostriction along various principal directions of a slow cooled $Fe_{82.9}$—$Ga_{17.1}$ single crystal with applied field along a [110] axis. The red curve shows measured magnetostriction along [001] direction, this direction being normal to the disc as shown schematically in the lower-left inset. The lower-middle schematic shows expansion along all directions in the plane of the disc. The upper-middle inset shows magnetization along [100] type direction along with simultaneously measured orthogonal (vector) data in the [001] direction, the latter being negligible in the field range where NJM is observed. The lower-right inset shows an image of the micro-strain gauge setup attached to the cylindrical surface of a sample.

Precision measurements were undertaken to experimentally verify the assumption that magnetostriction normal to the discs is negligible. The results are presented by the red curve in FIG. 12. NJM was measured with a strain-gauge technique (Chopra and Wuttig, Non-Joulian magnetostriction. Nature 521, 340-343, doi:10.1038/nature14459, 2015; Sullivan, Wheatstone bridge technique for magnetostriction measurements. Review of Scientific Instruments 51, 382-383, doi:http://dx.doi.org/10.1063/1.1136225, 1980) that uses a Wheatstone bridge combined with lock-in null detection featuring a resolution is 0.2 ppm. The micro-strain gauges (300 μm gauge length) were attached on the cylindrical surfaces of the samples (lower-right inset in FIG. 12). The data shows a very small strain, 1.3 ppm, normal to the disc. In this example, the field was directed parallel to the [110 axis] of the Fe—Ga crystal. Its longitudinal and transverse magnetostriction strains equal 70 ppm and 62 ppm, respectively, whereas strain along [100] equals 89 ppm, FIG. 12. A similarly negligible strain (1 ppm) occurs when the field is directed along the [100] axis (not shown). Commensurately, it was noted that the vector component of magnetization in the [001] direction for an in-plane field (along any in-plane direction) is negligible, see upper inset of FIG. 12, consistent with the conclusion that the disc expands and the volume is not conserved (NJM). The observed NJM is presumed shown to originate from the nm scale lamellar structure within the highly periodic cellular domains shown in FIG. 3. Degradation of the lamellar/cellular structure causes the disappearance of non-Joulian behavior. The generalized Landau-type magnetic structure in FIG. 3 has an electronic origin (CDWs) and a long coherence. Its existence is a prerequisite of the non-Julian character of the magnetostriction in FeGa.

Example 2

Magnetization Curves

The magnetization curves of these body center cubic (bcc) Fe-rich non-Joulian magnets and the similar solid solutions of Fe—Ge and Fe—Al (FIGS. 2A-2C) exhibit equally unusual combinations of magnetic characteristics: they are reversible, linear, non-hysteretic curves resembling rotation, but at the same time they are identical in all crystallographic orientations, as if the material were somehow amorphous. (For reference, in an isotropic ferromagnet, $\lambda_{//}=-2\lambda_\perp$ i.e. $\lambda_{//}+2\lambda_\perp=0$ or zero volume variation for JM; whereas $\lambda_{//}+2\lambda_\perp \neq 0$ characterizes NJM). They saturate at relatively low fields and feature unusually low anisotropy energies, as low as ~$10^2$-$10^3$ J/m$^3$ (Rafique et al., Magnetic anisotropy of FeGa alloys. J. Appl. Phys. 95, 6939-6941, doi:10.1063/1.1676054, 2004). For comparison, conventional magnets such as Fe, Co or Ni display hysteretic (square) and linear magnetization curves along easy and hard axes, as shown schematically in FIG. 2D, and their magnetocrystalline anisotropy is 2-4 orders of magnitude larger.

Example 3

Mechanistic Considerations

Figure 8:
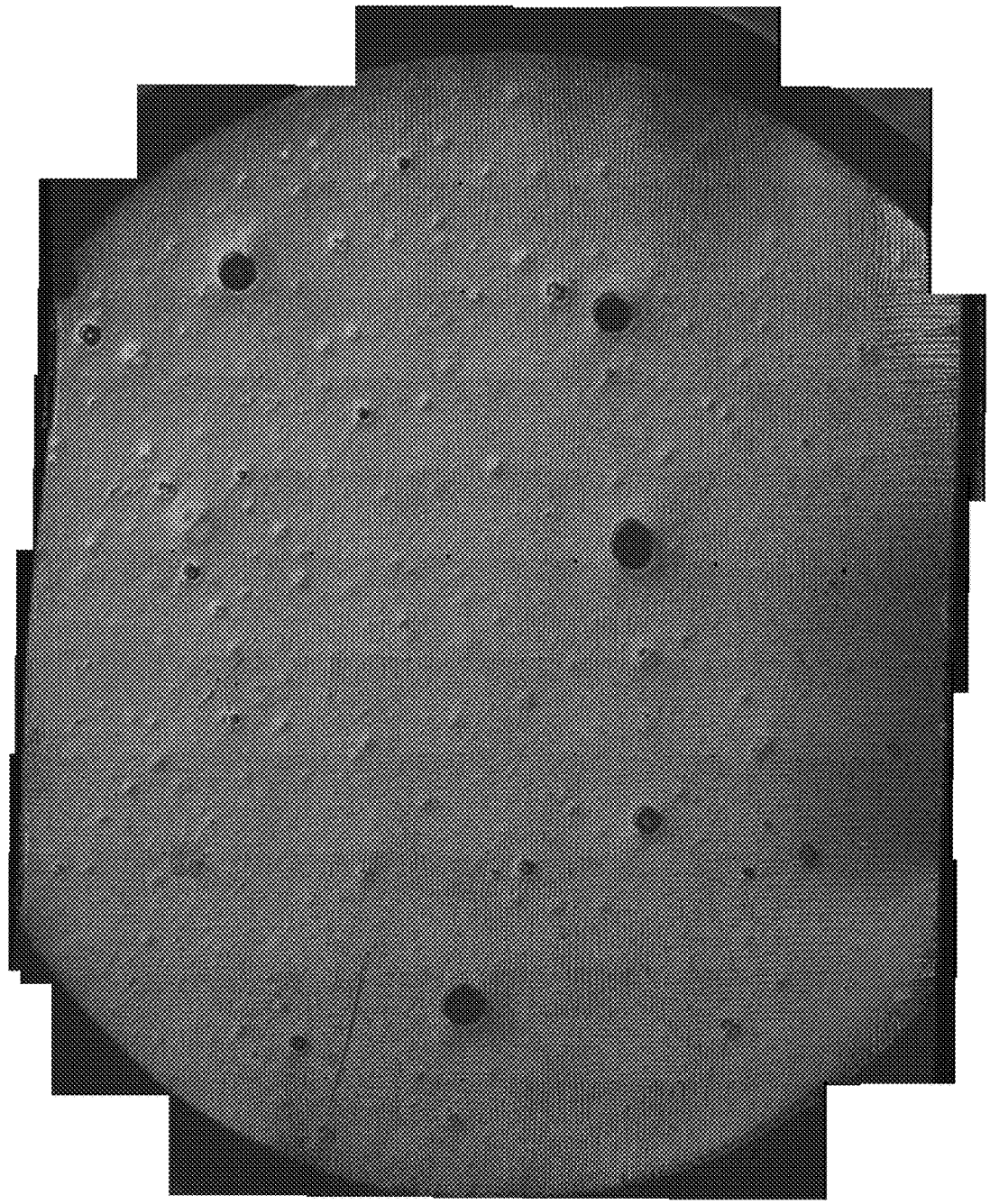
FIG. 8 is a photographic collage showing magnetic domains across the entire 5 mm diameter circular single crystal sample of $Fe_{73.9}$—$Ga_{26.1}$, which was rapidly quenched from 1,033 K to room temperature. The collage was prepared after polishing and etching the sample but before applying any magnetic field. Notice the existence of micromagnetic motifs along both [100] and [010] axes. Also notice the existence of APBs. The collage consists of high resolution images. Original magnification is ×5.

The non-volume-conserving magnetostriction along with non-hysteretic and linear magnetization resembling rotation in all directions cannot be explained by the conventional picture of JM or in terms of conventional ferromagnets. Ultimately, any mechanism of NJM must allow for volume changes and simultaneously explain the confounding directional independence of magnetization curves. Before explaining it, a clue to its origins is found in the micromagnetic structure in FIG. 3, which shows that the non-Joulian magnetostrictive strain, marked in blue (along [100]) or green (along [110]) in FIGS. 1A and 1B, is associated with microscopic reorientation of rigid cells. Only a small non-linear strain ~16-20 ppm (marked in red) in FIGS. 1A and 1B near saturation fields constitutes conventional or JM. The cellular magnetic structure responsible for NJM is shown in FIG. 3A. The image is notable for its exceptional magnetic periodicity (large coherence length) along the vertical [010] and the horizontal [100] directions, $\Lambda_{transverse}$~43 μm and $\Lambda_{longitudinal}$~12-14 μm, respectively. This long-range periodicity prevails over the entire disk, which is 5 mm in diameter (FIG. 8). A higher-magnification image, FIG. 3B, displays cells in adjacent horizontal bands with identical micromagnetic arrangements, shown schematically in FIG. 3C. However, the domain walls are mirror images of each other in the ferrofluid pattern due to their opposite chirality; domain walls with lighter contrast in a given horizontal band appear dark in adjacent bands. This reversal of spin chirality along the transverse direction reflects long-range order, as evidenced by its repetition over macroscopic distances (~mm). Note that the ripples on selected boundaries represent the signature of twins. Also notice the four-fold periodicity of layers, which is interpreted as representing the possibility and/or impossibility of observing twins end-on. It is being shown that this structure embodies a generalized Landau structure to accommodate the large magnetostriction and differences in saturation magnetization in the base and c-directions of the underlying tetragonal state (see Supplementary Information and FIG. 9). Occasionally, the periodicity is broken by defects resembling anti-phase boundaries (APBs; FIG. 3D). An APB causes a precise vertical displacement of a section of the pattern relative to its adjacent regions by an amount equal to $½\Lambda_{Transverse}$. As a consequence, the chirality of domain walls changes along a given horizontal band. At higher magnifications, domain walls are found to be not straight but zigzagged (FIG. 3E), revealing an even finer structural heterogeneity at the sub-microscopic scale. The zigzagged walls show that the idealized schematization of magnetization in FIG. 3C in fact also follows a zigzagged pattern, as shown in a highly exaggerated schematic in FIG. 3F. A special feature of each 'cell' within any horizontal band, whose periodicity is labelled as $\Lambda_{longitudinal}$ in FIG. 3C, is their magnetostatically and magnetoelastically autarkic character; that is, the cells represent entities that are demagnetized and deelasticized. Here the term 'deelasticized' is used to imply long-range cancellation of elastic fields analogous to the term 'demagnetized' in magnetism. This can be seen from a schematic of magnetization within each cell in FIG. 3C; the pattern notably differs from one seen in conventional magnets, in which vertical segments defining the cell boundaries are absent. A simple analysis of magnetostrictive strains further shows that they are de-elasticized (FIG. 3G), since the net force at each node of the cell is zero (nodes are stable) at zero-field.

Figure 3H:
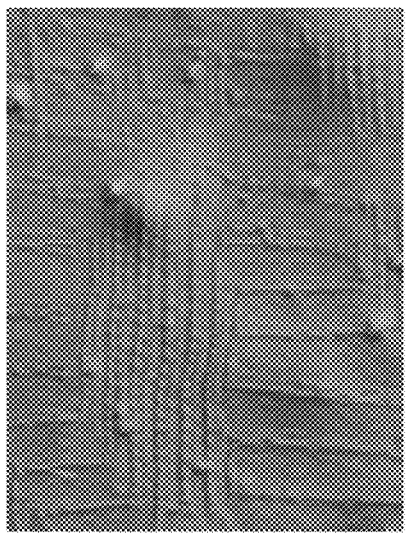
FIGS. 3Ha-3Hd depict the field dependence of magnetic domains. Applied field is in horizontal, [100], direction. The respective fields are 0, 186, 248, and 0 Oe. Original magnification is ×10.
Figure 3H:
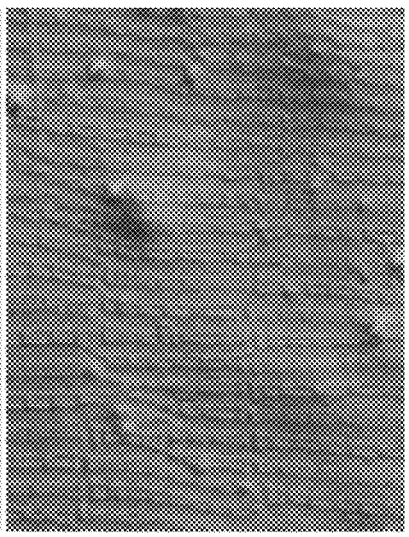
Figure 3H:
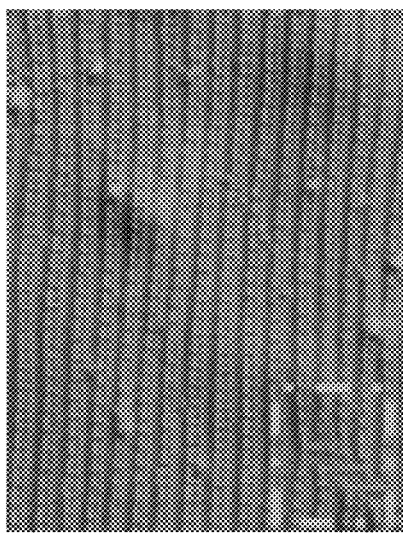
Figure 3H:
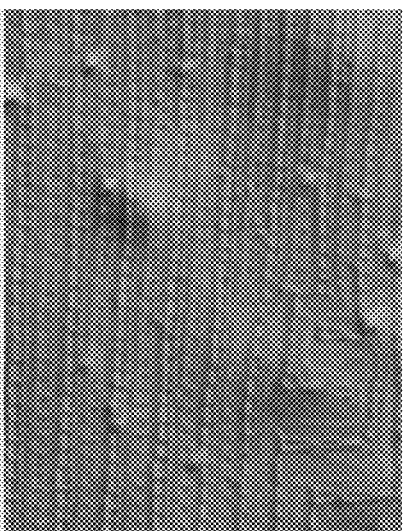
Figure 4:
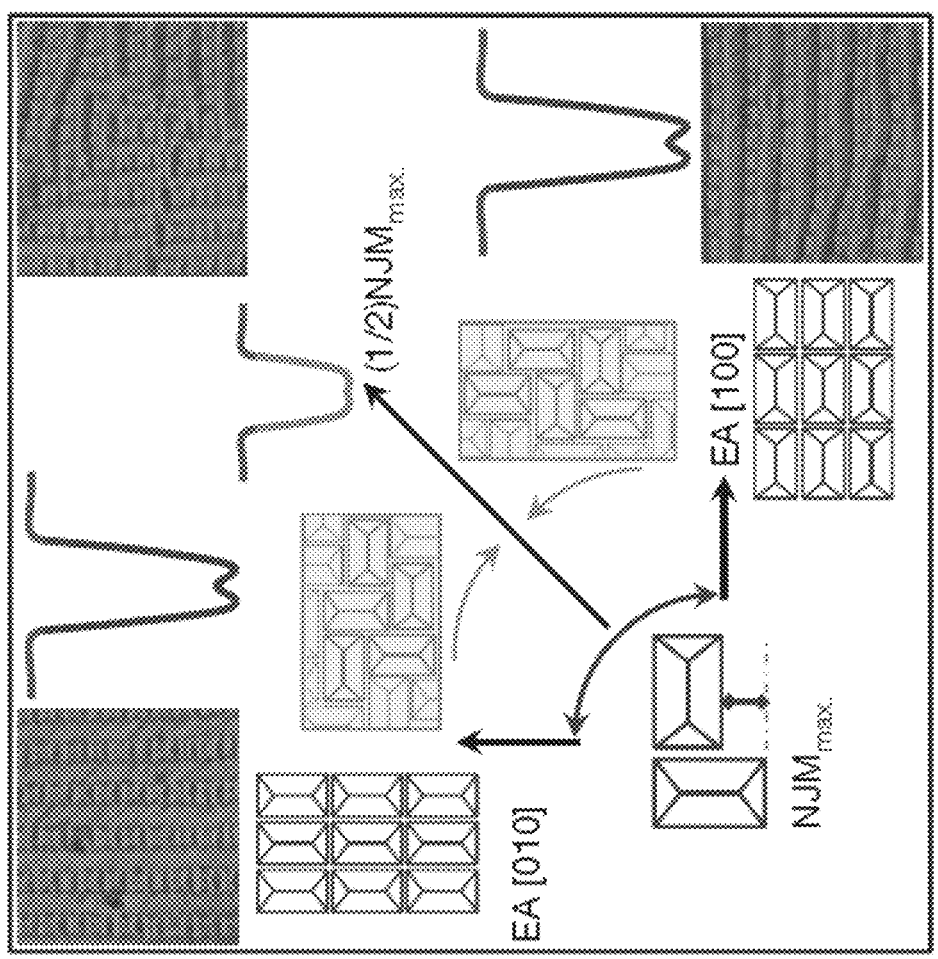
FIG. 4 is a schematic depicting the rule of mixture explaining the angular dependence of NJM. The rule is based on the fact that cells either exist along the [100] or [010] directions. EA: easy axis.
Figure 5B:
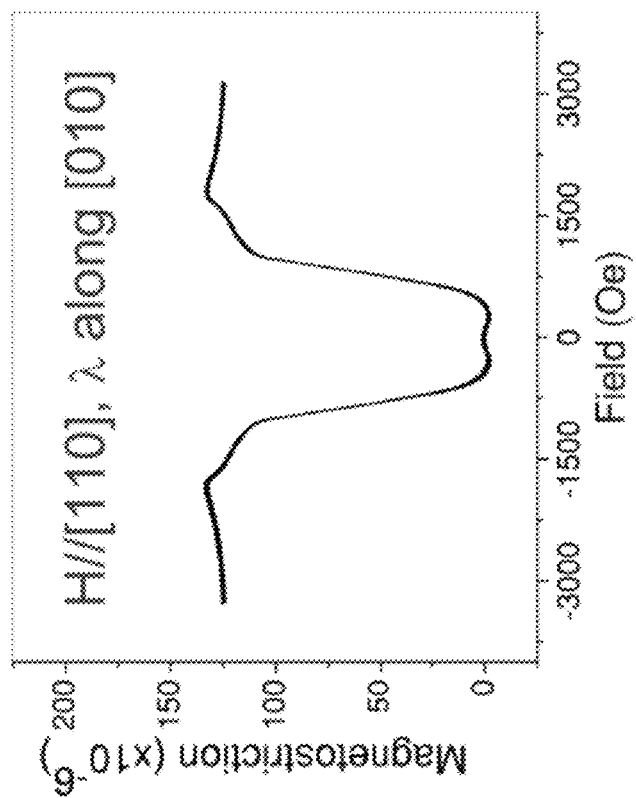
FIGS. 5A-5G, is a series of charts depicting the anisotropy of magnetostriction. The data displays the angular dependence of magnetostriction along various directions in an as-quenched Fe73.9-Ga26.1 single crystal.
Figure 5A:
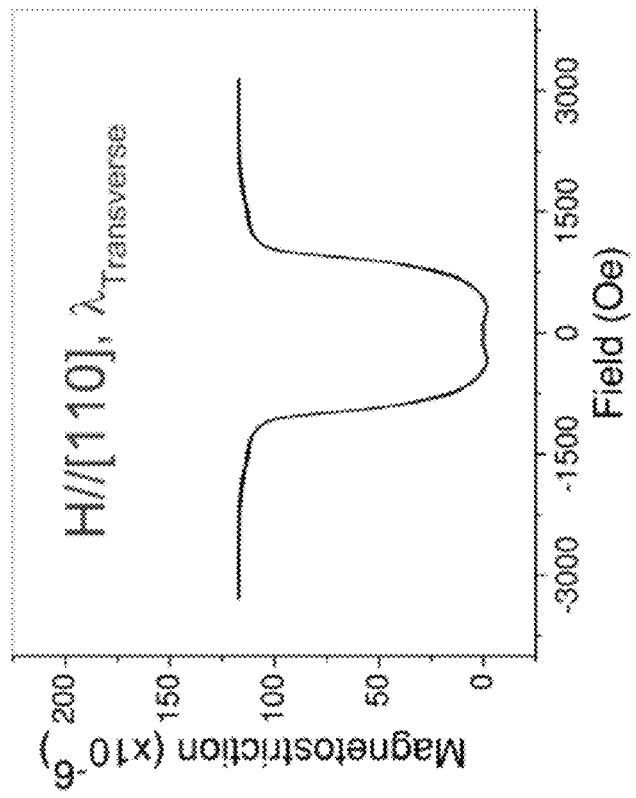
Figure 5D:
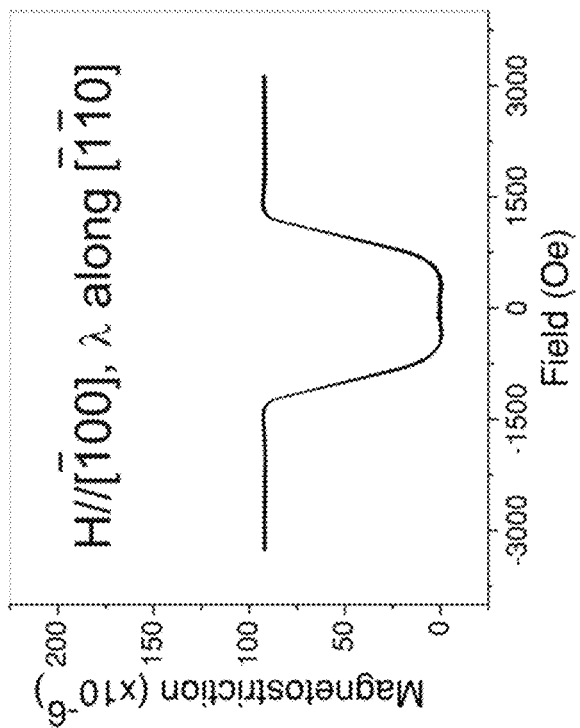
Figure 5C:
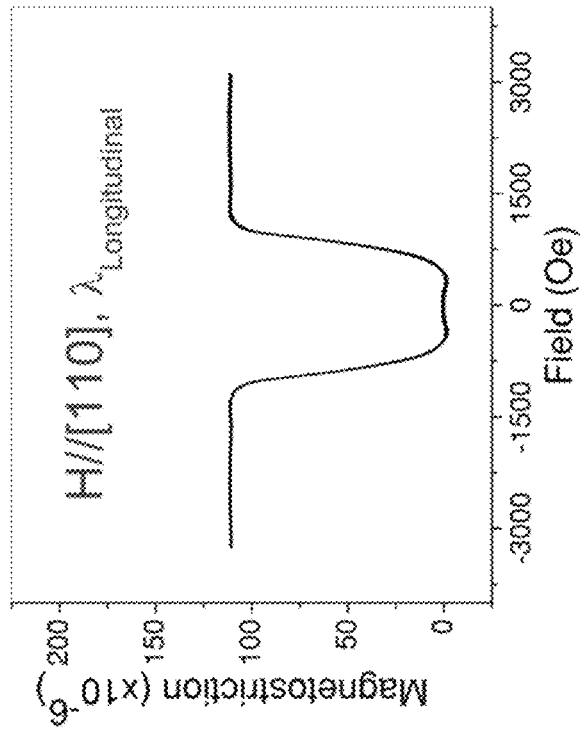
Figure 5F:
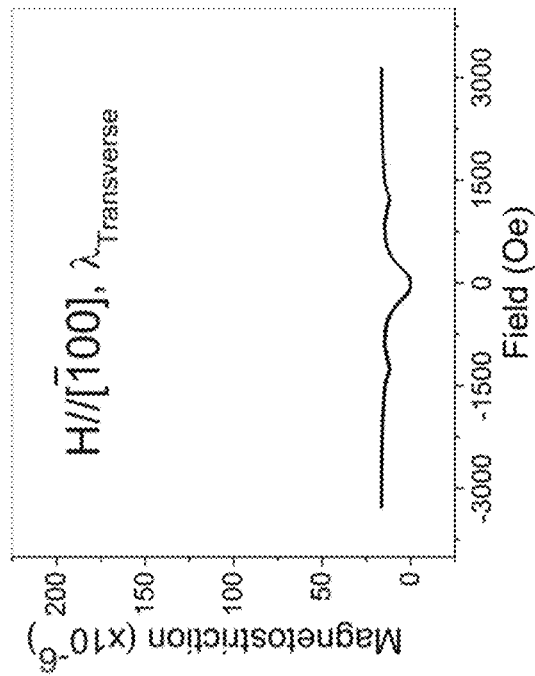
Figure 5E:
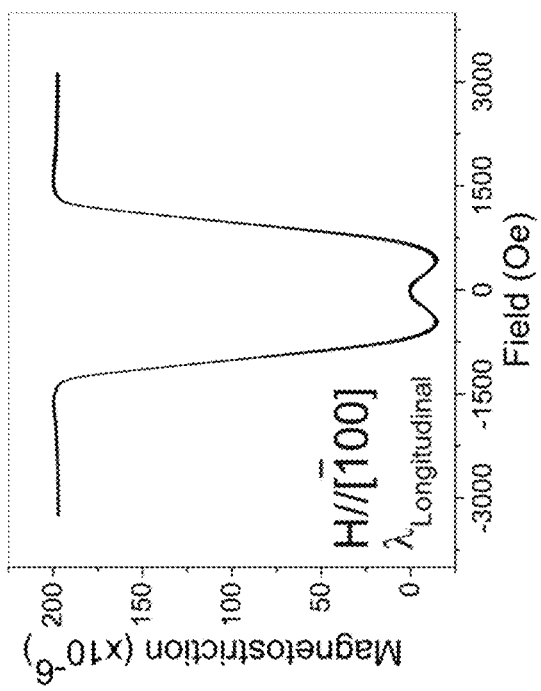
Figure 5G:
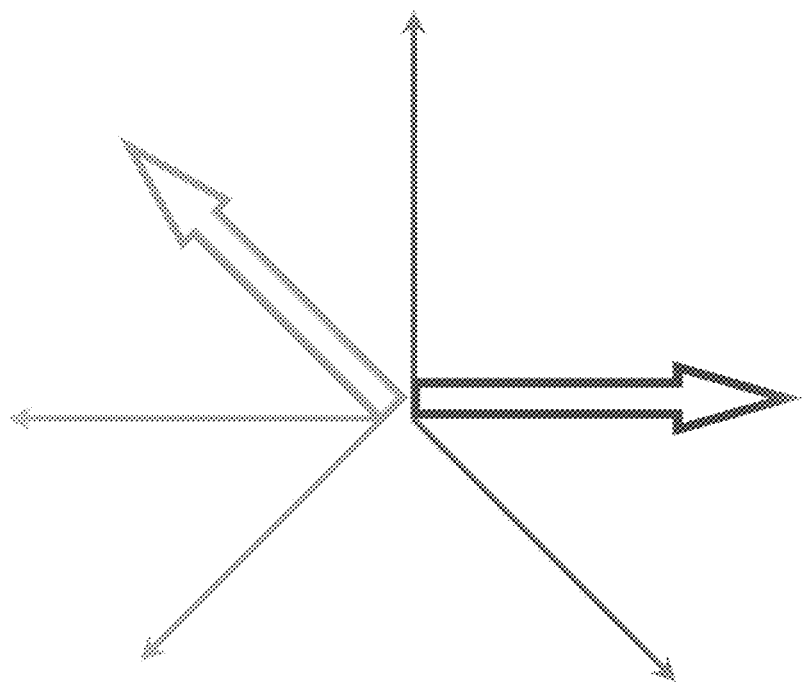

The panel of micrographs in FIGS. 3Ha-3Hd shows snapshots of in situ micromagnetic studies revealing the cell's bidirectional stability—they either exist along [100] or [010], and no other angle in between. These cells abruptly reorient as a 'unit' along one of the two directions when a magnetic field is applied along [100] or [010]. During micromagnetic studies it was noticed that 'defects' or APBs often serve as initiation sites for cell rotation. The window in FIG. 3Ha (bottom left) highlights this observation. The abrupt nature of this reorientation was further verified by Barkhausen noise measurements. This reorientation is facilitated by the screening through the demagnetizing and de-elastification fields. Starting with the observation that cells are magnetostatically and magnetoelastically self-sufficient, it is noted that the change of the direction of magnetization at low fields is accomplished by abrupt cell reorientation and not by coherent rotation of the magnetization, as is the case for JM. The magnetocrystalline anisotropy must therefore consist of two parts, one controlled by cell reorientation and the other controlled by coherent rotation of the magnetization near saturation fields. The magneto-'crystalline' anisotropy energy of coherent magnetization rotation in $Fe_{82}$—$Ga_{17}$ equals $K_{coh}$~$3\times10^4$ J/m$^3$, when determined from magnetization curves (Rafique et al., Magnetic anisotropy of FeGa alloys. J. Appl. Phys. 95, 6939-6941, doi:10.1063/1.1676054, 2004). However, torque magnetometry (Lisfi et al., The power of torque magnetometry: defect induced switching in hexaferrite nano-structures. Nanotechnology 25, 415702, 2014) was able to reveal an additional uniaxial anisotropy superimposed on the expected four-fold anisotropy of the crystal. The two-fold anisotropy, $K_{cell}$, is very small, ~$4\times10^{-2}K_{coh}$, assuring cell rotation in advance of coherent rotation. Similarly low values in Fe—Al and Fe—Ge alloys were found (data not shown). The Fe-17.1 at % Ga alloy in FIG. 1B shows similar micromagnetic behavior, as does Fe-26.1 at % Ga. The alloy with 26.1 at % Ga is chosen for illustration because it displayed fewer surface scratches. Having found similar behavior in the two alloys on either side of the composition at which peak magnetostriction occurs (~19-20 at % Ga; Xing et al., Structural investigations of Fe—Ga alloys: Phase relations and magnetostrictive behavior. Acta Materialia 56, 4536-4546, doi:http://dx.doi.org/10.1016/j.actamat.2008.05.011, 2008; Clark et al., Extraordinary magnetoelasticity and lattice softening in bcc Fe—Ga alloys. J. Appl. Phys. 93, 8621-8623, doi:http://dx.doi.org/10.1063/1.1540130, 2003), similar behavior is expected under suitable thermal history.

Figure 3I:
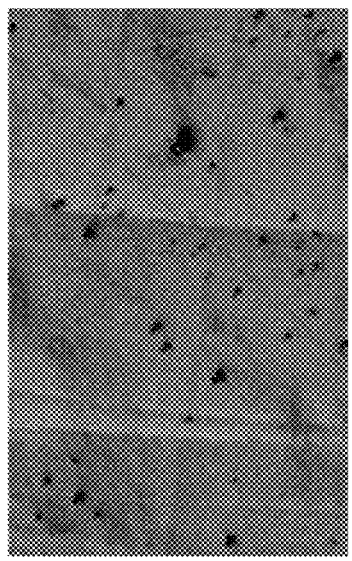
FIGS. 3Ia-3If depict the evolution of microstructure in externally applied field. The field is normal to the bands.
Figure 3I:
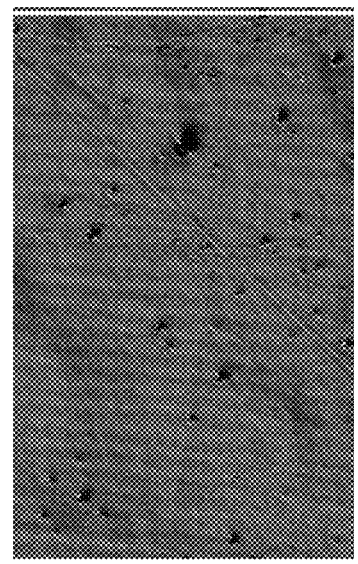
Figure 3I:
Figure 3I:
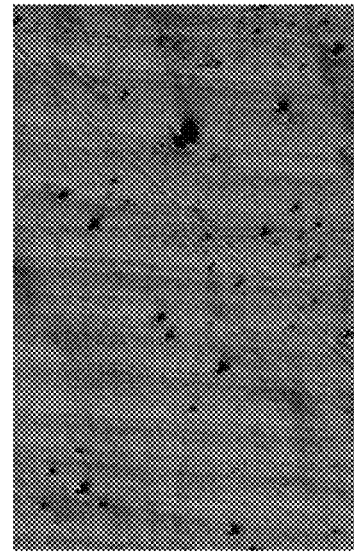
Figure 3I:
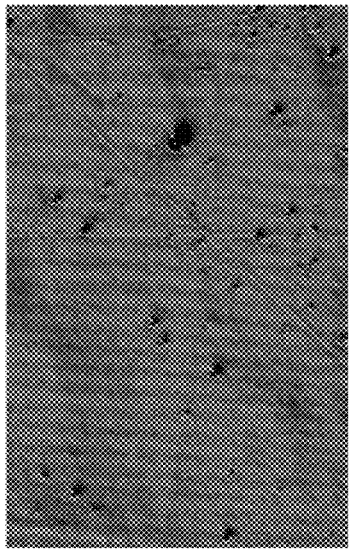
Figure 3I:
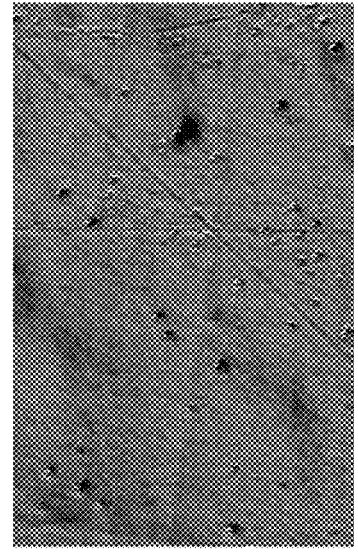

In carefully prepared Fe—Ga single crystal samples that are free of any polishing-induced deformation layers, the existence of a microscopic-scale structural heterogeneity in the form of plane-parallel bands along the <100> type crystal direction becomes apparent, as shown in the differential interference contrast (DIC) optical micrograph in FIGS. 3Ia-3If. The images were recorded on a 'free' sample, that is, without constraining the sample with an underlying substrate. In other words, the material spontaneously exists in this folded state at zero-field. The panel of micrographs in FIGS. 3Ia-3If shows that the folded structure can be progressively 'unfolded' by applying magnetic fields of increasing strength (FIGS. 3Ia-3Ic). The applied field is directed horizontally, approximately perpendicular to the bands. When the field strength is reduced back to zero, the crystal spontaneously returns to its folded state (FIGS. 3Id-3If), that is, the cellular structure represents an equilibrium state. This unfolding and folding process occurs by motion of bands normal to themselves and their coalescence. After reducing the field strength to zero (FIG. 3If), the periodicity and orientation of the bands remains unchanged relative to FIG. 3Ia, indicating that they are of crystallographic origin. As-quenched stresses could be present. However, it is believed that the extraordinarily long coherence length of the micromagnetic structure (FIG. 3A and FIG. 8) indicates that they do not interfere with the formation of the pattern, its reproducibility (FIG. 10), or the observation of NJM. In addition, in one of the experiments, samples were slowly heated to ~500K (~1 K/min) to eliminate potential quenching stresses. The micropatterns taken before and after this experiment remain unchanged. The observed micromagnetic images are highly reproducible, that is, they represent an equilibrium state (FIG. 10). The DIC images (FIG. 3Ia versus FIG. 3If) show similar reproducibility after cycling in applied fields.

The magnitude of observed NJM in these crystals, including the observation that $\lambda_{110} \approx \frac{1}{2}\lambda_{100}$ and is always of positive sign, can now be explained on the basis of a simple rule of mixture based on the population of cells along the two principal axes, [100] and [010], as summarized in FIG. 4. Initially, consider all the cells to be aligned along the [100] axis. When H∥[110], cells do not rotate along [110]. Instead, half the cells reorient along [010], the other half remain along [100], and a strain of 100 ppm is realized along [110] equal to half the strain along the principal [100] axis. Any further increase in field beyond this point causes destruction of cells due to coherent rotation associated with small JM. When H∥[010], all the cells reorient along [010], and a maximum strain of 200 ppm associated with the self-strain of the cells is observed. It is followed by a small JM associated with destruction of cell structure at high fields.

Any volume increase must necessitate changes of the lattice constants of the crystal. The conventional adaptive mechanisms such as JM or self-accommodation of ferroelastic domains in the martensite state of shape memory alloys (Chopra et al., Domain structures in bent In-22.5 at.%Tl polydomain crystals. Acta Materialia 44, 747-751, doi:http://dx.doi.org/10.1016/1359-6454(95)00183-2, 1996), are all volume conserving. In NJM alloys, the highly periodic magnetoelastic structure over macroscopic distances is in fact composed of microscopic repeat cells whose boundaries are defined by zigzagged domain walls of sub-microscopic segments. The zigzagged walls demonstrate that magnetization within the cells is not uniform (FIG. 3F). Stated differently, the lattice is modulated. Such a modulation involves strain gradients that relax in an applied field, giving rise to change in the volume of the crystal. It has been shown that a term $f \cdot \nabla(\varepsilon \times \eta)$ (Pirc et al., Mesoscopic model of a system possessing both relaxor ferroelectric and relaxor ferromagnetic properties. Physical Review B 79, 7, doi:10.1103/PhysRevB.79.214114, 2009), where ε represents strain and η an order parameter, such as a spontaneous polarization, accounts for the macro- and nano-flexostriction in ferroelectrics (Fu and Cross, On the flexoelectric effects in solid dielectrics: Theories and applications. Ferroelectrics 354, 238-245, doi:10.1080/00150190701455005, 2007). It is proposed that the amplitude of charge density waves (CDWs; Gruner, Density Waves in Solids. Perseus Publishing, 2000; Grüner, The Dynamics of Charge-density waves. Rev. Mod. Phys. 60, 1129-1182, doi:10.1103/RevModPhys.60.1129, 1988) represents the order parameter that can describe the atomic origin of the macroscopically modulated state discovered here; the direct replacement of the polarization order parameter by the magnetization would violate time inversion symmetry. The long-range periodicity is a hallmark of CDWs, which are also well known to accompany a soft $TA_2$ phonon mode as observed in Fe—Ga (Wuttig et al., Elasticity and magnetoelasticity of Fe—Ga solid solutions. Appl. Phys. Lett. 80, 1135-1137, 2002). Briefly, a CDW is a modulation of the conduction electrons that occurs concurrent with the lattice distortion. In such systems the increase in elastic energy is offset by a greater decrease in energy of the conduction electrons. The coupled distortion of the conduction electron density and the crystal leads to an overall decrease in the energy of the crystal, and equilibrium is reached when $$\frac{\partial}{\partial \Delta}(E_{elec.} + E_{elas.}) = 0;$$

$E_{elec.}$ and $E_{elas.}$ are the electronic and elastic energy terms, respectively, and the extent of distortion Δ being determined by the size of the electronic energy gap. In a nonmagnetic system, there is no possibility of changing the lattice modulations caused by CDW through an applied magnetic field. However, in a ferromagnetic medium, the spin will automatically redistribute. Thus, the system becomes susceptible to external magnetic fields and therefore tunable. This allows the modulation of a CDW to be unfolded continuously in a varying field, whose macroscopic manifestation can be seen in FIGS. 3Ia-3If. Other mechanisms may give rise to lattice modulation. Those leading to a volume increase include volume magnetostriction, and forced magnetostriction associated with a strain gradient of exchange energy or the magnetostatic form factor. However, these mechanisms yield only miniscule volume increases (du Trémolet de Lacheisserie et al., Magnetism Fundamentals. Springer, Grenoble Sciences France), much smaller than those observed here.

Example 4

Origin of Magnetically and Elastically Compensated State

Figure 9D:
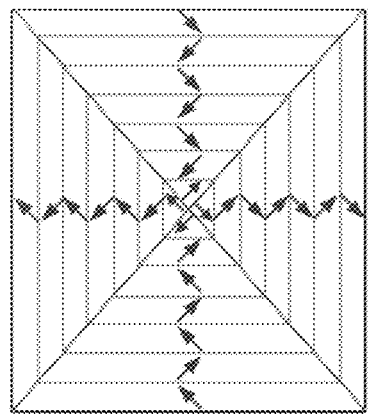
FIGS. 9A-9D, is a series of schematics depicting the origin of magnetically and elastically compensated state.
Figure 9C:
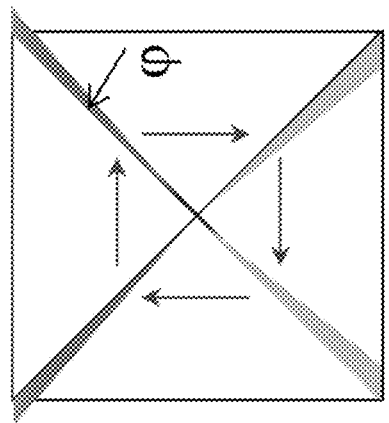
Figure 9B:
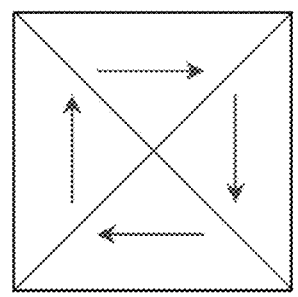
Figure 9A:
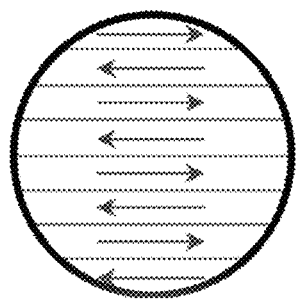

The 180 degree Bloch walls oriented along a magnetically easy direction generate the demagnetized state of a thin circular ferromagnetic plate (FIG. 9A). If the magnetostriction of the material equals zero the Bloch walls may be considered laminates of two 90 degree walls. Therefore, the spontaneous magnetization at the center of the 180 degree walls is directed normal to the walls. This fact is of little consequence as long as $\lambda_{100} \ll 1$. However, it becomes significant if $\lambda_{100}$ is finite as it does in the Fe—Ga, Al, Ge family. In this case, a significant stress arises in the center of the 180 degree Bloch walls causing the crystal to twin thereby forming the state discovered here.

Before considering the accommodation of the large magnetostrictive strain by twinning, recall the magnetic structure of the demagnetized state of a square ferromagnetic thin film with $\lambda_{100}=0$. The square will be diagonally segmented by 90 degree walls (FIG. 9B). However, if $\lambda_{100}$ becomes finite diagonals will rotate by an angle $$\varphi = \arctan\left(\frac{1 - \frac{1}{3}\lambda_{100}}{1 + \frac{2}{3}\lambda_{100}}\right) - \frac{1}{4}\pi$$

if $$\lambda_{100} < 0 \text{ and } \varphi = \arctan\left(\frac{1 + \frac{2}{3}\lambda_{100}}{1 - \frac{1}{3}\lambda_{100}}\right) - \frac{1}{4}\pi$$

for $\lambda_{100} > 0$, thereby introducing significant stresses into the film (FIG. 9C). These stresses will be alleviated by twinning so that the square becomes a rectangle (FIG. 9D). The width of the twins, $w \approx \sqrt{w_0 L}$, $w_0$-characteristic twinning distance, L-length of square.

The principle of magnetoelastic twinning can be extended to three dimensions. In the absence of magnetostriction the demagnetized state of a cube will be the equivalent to FIG. 9B, i.e., the six surfaces of the cube, diagonally segmented, will be magnetized like their 2-dimensional analogues, except, this magnetization pattern will extend into the interior of the cube. In materials with finite magnetostriction, this cube will be twinned so that its overall shape can become the three dimensional stress relieved demagnetized cuboid equivalent to those seen in FIG. 3.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

The invention claimed is:

1. An actuator comprising a material comprising iron and a group 13 or 14 element, wherein the total volume of the material is capable of changing when the material is placed in a magnetic field;
wherein the actuator responds to a change in the total volume of the material.

2. The actuator of claim 1, wherein the group 13 or 14 element is selected from the group consisting of aluminum, gallium, germanium, and silicon.

3. The actuator of claim 1, wherein the concentration of transition metal in the material is between 60 to 100%.

4. The actuator of claim 1, wherein the concentration of transition metal in the material is between 60 to 99.9%.

5. The actuator of claim 1, wherein the volume change is an increase.

6. The actuator of claim 1, wherein the volume change is a decrease.

7. The actuator of claim 1, wherein the material is a magnet.

8. The actuator of claim 1, wherein the material is ferromagnetic.

9. The actuator of claim 1, wherein the material is a crystalline transition metal alloy of cubic crystal symmetry.

10. The actuator of claim 1, comprising about 73.9% iron and about 26.1% gallium.

11. The actuator of claim 1, comprising about 82.9% iron and about 17.1% gallium.

12. The actuator of claim 1, wherein the material is crystalline and the volume change is due to dimensional strains of different relative magnitude along the different directions of the crystalline lattice of the material.

13. The actuator of claim 12, wherein the relative magnitude of the dimensional strains is between 0.1 to 3000 ppm at room temperature.

14. The actuator of claim 12, wherein the maxima of longitudinal dimensional strain occurs along any crystal direction where longitudinal magnetostriction means measured strain is along applied magnetic fields.

15. The actuator of claim 12, wherein the relative magnitude of the dimensional strains is between 0.1 to 3000 ppm in the transverse directions at room temperature.

16. The actuator of claim 12, wherein the maxima of transverse dimensional strains could occur along any crystal direction, where transverse magnetostriction means measured strain is perpendicular to the applied magnetic fields.

17. The actuator of claim 12, wherein the maxima of longitudinal dimensional strain occurs along the easy directions of the crystalline lattice.

18. The actuator of claim 1, wherein the material is crystalline and the volume change is due to dimensional strains of similar relative magnitude along the different directions of the crystalline lattice of the material.

19. The actuator of claim 18, wherein the relative magnitude of the dimensional strains is between 0.1 to 3000 ppm.

20. The actuator of claim 18, wherein the maxima of longitudinal dimensional strain occurs along the easy directions of the crystalline lattice.

21. The actuator of claim 1, wherein the volume change results in a heat loss of about 0 J as the magnet is cycled in magnetic fields.

22. The actuator of claim 1, wherein the material has a crystalline structure and exhibits plane-parallel micromagnetic cellular bands along the <100> type crystal direction.

23. The actuator of claim 22, wherein the cells have nanoscale magnetic gradients within.

* * * * *